US012809478B2

United States Patent

(12) United States Patent
Shang et al.

(10) Patent No.: US 12,809,478 B2
(45) Date of Patent: Nov. 24, 2026

(54) TOUCH PANEL AND METHOD FOR PREPARING SAME, AND TOUCH DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yanyang Shang, Beijing (CN); Zhenglong Yan, Beijing (CN); Kemeng Tong, Beijing (CN); Jun Yan, Beijing (CN); Tingliang Liu, Beijing (CN); Xiangdan Dong, Beijing (CN); Tao Han, Beijing (CN); Yi He, Beijing (CN)

(73) Assignees: CHENGDU BOX OPTOELECTRONICS TECHNOLOGY CO., LTD., Chengdu (CN); BOB TECHNOLOGY GROUP CO., LTD., Beijing (CN)

( * ) Notice: Subject to any disclaimer, the term of this patent is extended or adjusted under 35 U.S.C. 154(b) by 21 days.

(21) Appl. No.: 18/995,163

(22) PCT Filed: Apr. 18, 2024

(86) PCT No.: PCT/CN2024/088672

§ 371 (c)(1),
(2) Date: Jan. 16, 2025

(87) PCT Pub. No.: WO2024/244804

PCT Pub. Date: Dec. 5, 2024

(65) Prior Publication Data

US 2026/0252188 A1 Aug. 27, 2026

(30) Foreign Application Priority Data

May 29, 2023 (CN) ......................... 202310620483.4

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0445* (2019.05); *H10K 59/1201* (2023.02);
(Continued)

(58) Field of Classification Search
CPC ............... G06F 3/04164; G06F 3/0445; G06F 2203/04103; G06F 2203/04111;
(Continued)

(56) References Cited

U.S. PATENT DOCUMENTS 10,418,424 B2 * 9/2019 Oh ........................ G06F 3/0412
10,714,544 B2 * 7/2020 Kang .................... G06F 3/0412
(Continued)

FOREIGN PATENT DOCUMENTS

CN 112860122 A 5/2021
CN 113725231 A 11/2021
(Continued)

*Primary Examiner* — Michael Pervan
(74) *Attorney, Agent, or Firm* — XSENSUS LLP

(57) ABSTRACT

Disclosed is a method for preparing a touch panel. In this method, before a color filter layer in the touch panel is formed, an initial protection layer or an initial encapsulation layer is used to protect the connection interface disposed in a bonding region of the display module.

20 Claims, 20 Drawing Sheets

(51) Int. Cl.

| | |
|---|---|
| ***H10K 59/12*** | (2023.01) |
| ***H10K 59/131*** | (2023.01) |
| ***H10K 59/38*** | (2023.01) |
| ***H10K 59/40*** | (2023.01) |
| ***H10K 59/80*** | (2023.01) |

(52) U.S. Cl.
CPC ......... *H10K 59/1315* (2023.02); *H10K 59/38* (2023.02); *H10K 59/40* (2023.02); *H10K 59/873* (2023.02); *H10K 59/8792* (2023.02); *G06F 2203/04103* (2013.01); *G06F 2203/04111* (2013.01)

(58) Field of Classification Search
CPC ........... H10K 59/1201; H10K 59/1315; H10K 59/38; H10K 59/40; H10K 59/873; H10K 59/8792
See application file for complete search history.

(56) References Cited

U.S. PATENT DOCUMENTS

| | | | | |
|---|---|---|---|---|
| 11,050,041 | B2 * | 6/2021 | Choi | H10K 59/122 |
| 11,079,885 | B2 * | 8/2021 | Jo | G06F 3/04164 |
| 11,592,944 | B2 * | 2/2023 | Jo | G06F 3/04164 |
| 11,844,232 | B2 * | 12/2023 | Choi | H10K 59/122 |
| 11,846,965 | B2 * | 12/2023 | Lee | G06F 3/0412 |
| 11,907,485 | B2 * | 2/2024 | Jo | G06F 3/04164 |
| 12,238,960 | B2 * | 2/2025 | Choi | H10K 59/122 |
| 2018/0061898 | A1 * | 3/2018 | Oh | G06F 3/0412 |
| 2018/0182816 | A1 * | 6/2018 | Kang | G06F 3/0412 |
| 2020/0144341 | A1 | 5/2020 | Choi et al. | |
| 2020/0363905 | A1 * | 11/2020 | Jo | G06F 3/04164 |
| 2021/0313542 | A1 * | 10/2021 | Choi | H10K 59/122 |
| 2021/0326001 | A1 * | 10/2021 | Jo | G06F 3/04164 |
| 2022/0206620 | A1 * | 6/2022 | Lee | G06F 3/0412 |
| 2023/0176698 | A1 * | 6/2023 | Jo | G06F 3/04164 345/174 |
| 2023/0380211 | A1 * | 11/2023 | Choi | H10K 59/122 |

FOREIGN PATENT DOCUMENTS

| | | | |
|---|---|---|---|
| CN | 113851491 | A | 12/2021 |
| CN | 114574803 | A | 6/2022 |
| CN | 115776832 | A | 3/2023 |
| WO | 2021189483 | A1 | 9/2021 |

* cited by examiner

S1011: Acquiring a base substrate

↓

S1012: Forming a plurality of pixel units and a plurality of conductive pattern groups spaced apart on a side of the base substrate

↓

S1013: Forming an encapsulation film layer on a side of the plurality of pixel units away from the base substrate

TOUCH PANEL AND METHOD FOR PREPARING SAME, AND TOUCH DEVICE

CROSS-REFERENCE TO RELATED APPLICATIONS

The present disclosure is a U.S. national phase application based on PCT/CN2024/088672, filed on Apr. 18, 2024, which claims priority to Chinese Patent Application No. 202310620483.4, filed on May 29, 2023, and entitled "TOUCH PANEL AND METHOD FOR PREPARING SAME, AND TOUCH DEVICE", both of which are incorporated by reference herein.

TECHNICAL FIELD

The present disclosure relates to the field of touch technologies, and in particular, relates to a touch panel and a method for preparing the same, and a touch device.

BACKGROUND

In order to make the display panel lighter and thinner to adopt to folded and curled products, touch panels of flexible multi-layer on cell touch technology have come into being.

SUMMARY

The present disclosure provides a touch panel and a method for preparing the same, and a touch device. The technical solutions are as follows.

In one aspect, a method for preparing a touch panel is provided. The method includes:

forming a display module, wherein forming the display module includes: acquiring a base substrate having a display region and a peripheral region surrounding the display region, the peripheral region including a bonding region; forming a plurality of pixel units and a plurality of conductive pattern groups spaced apart on a side of the base substrate, wherein the plurality of pixel units are disposed in the display region, the plurality of conductive pattern groups are disposed in the bonding region, each of the conductive pattern groups includes a plurality of conductive patterns stacked in sequence, the plurality of conductive patterns in each of the conductive pattern groups forming a connection interface; and forming an encapsulation film layer on a side of the plurality of pixel units away from the base substrate, wherein the encapsulation film layer is configured to encapsulate the plurality of pixel units, and a boundary of the encapsulation film layer is disposed between the connection interface and the display region;

forming an initial protection layer on a side of the encapsulation film layer away from the base substrate, an orthographic projection of the initial protection layer on the base substrate covering an orthographic projection of the connection interface on the base substrate;

forming a touch module on a side of the initial protection layer away from the display module;

forming a first insulating layer on a side of the touch module away from the display module, an orthographic projection of the first insulating layer on the base substrate covering the display region;

forming a color filter layer on a side of the first insulating layer away from the display module; and acquiring a target protection layer by etching the initial protection layer, wherein an orthographic projection of the target protection layer on the base substrate does not overlap an orthographic projection of a signal reception portion of the connection interface on the base substrate, the signal reception portion being connected to a driver circuit in the touch panel to receive a driving signal provided by the driver circuit.

In some embodiments, the plurality of connection interfaces includes a plurality of touch interfaces, wherein each of the touch interfaces includes a signal reception portion and a signal transmission portion, the signal transmission portion being close to the display region relative to the signal reception portion;

the initial protection layer further includes a plurality of first openings, wherein an orthographic projection of each of the first openings on the base substrate at least partially overlaps an orthographic projection of the signal transmission portion on the base substrate to expose at least a partial region of one signal transmission portion; and forming the touch module includes: forming a first touch layer, a touch insulating layer, and a second touch layer in sequence on a side of the initial protection layer away from the base substrate;

wherein the first touch layer includes a plurality of first touch connection patterns disposed in the bonding region, each of the first touch connection patterns and the signal transmission portion being connected through a first opening; the touch insulating layer has a plurality of second openings, an orthographic projection of each of the second openings on the base substrate partially overlapping an orthographic projection of the first touch connection pattern on the base substrate; and the second touch layer includes a plurality of second touch connection patterns disposed in the bonding region, a second touch connection pattern and the first touch connection pattern being connected through a second opening.

In some embodiments, the touch module includes a first touch electrode and a second touch electrode disposed in the display region and insulated from each other;

the first touch layer further includes a plurality of first touch connection lines corresponding to the plurality of first touch connection patterns, one end of each of the first touch connection lines being connected to a corresponding first touch connection pattern, and another end of each of the first touch connection lines being connected to the first touch electrode or the second touch electrode; and the second touch layer includes a plurality of second touch connection lines corresponding to the plurality of second touch connection patterns, one end of each of the second touch connection lines being connected to a corresponding second touch connection pattern, and another end of each of the second touch connection lines being connected to the first touch electrode or the second touch electrode.

In some embodiments, a boundary of the first opening away from the display region and a boundary of the target protection layer away from the display region are collinear; and a boundary of the second opening away from the display region and a boundary of the touch insulating layer away from the display region are collinear; and a boundary of the second touch connection pattern away from the display region is disposed on a side, close to the display region, of a boundary of the first insulating layer away from the display region.

In some embodiments, wherein the orthographic projection of the first opening on the base substrate is disposed within the orthographic projection of the second opening on the base substrate, and an area of the orthographic projection of the first opening on the base substrate is less than an area of the orthographic projection of the second opening on the base substrate; or, the orthographic projection of the second opening on the base substrate is disposed within the orthographic projection of the first opening on the base substrate, and an area of the orthographic projection of the second opening on the base substrate is less than the orthographic projection of the first opening on the base substrate.

In some embodiments, before forming the touch module, the method further includes:

forming a second insulating layer on a side of the initial protection layer away from the base substrate, wherein an orthographic projection of the second insulating layer on the base substrate covers the display region, and a boundary of the second insulating layer is disposed between the connection interface and the display region.

In some embodiments, the color filter layer includes a black matrix structure, a plurality of first color resist blocks of a first color, a plurality of second color resist blocks of a second color, a plurality of third color resist blocks of a third color, and a third insulating layer; and forming the color filter layer includes:

forming a black matrix film, wherein the black matrix structure is acquired by patterning the black matrix film using a first mask, the black matrix structure has a plurality of hollowed-out regions, each of the hollowed-out regions forming a color resist block;

forming a first color resist film of a first color, wherein the plurality of first color resist blocks of the first color are acquired by patterning the first color resist film using a second mask, each of the first color resist blocks of the first color being disposed in one of the hollowed-out regions;

forming a second color resist film of a second color, wherein the plurality of second color resist blocks of the second color are acquired by patterning the second color resist film using a third mask, each of the second color resist blocks of the second color being disposed in one of the hollowed-out regions;

forming a third color resist film of a third color, wherein the plurality of third color resist blocks of the third color are acquired by patterning the third color resist film using a fourth mask, each of the third color resist blocks of the third color being disposed in one of the hollowed-out regions; and forming a third insulating film, wherein the third insulating layer is acquired by patterning the third insulating film using a fifth mask, an orthographic projection of the third insulating layer on the base substrate covers the display region, and a boundary of the third insulating layer away from the display region is farther from the display region relative to a boundary of the first insulating layer away from the display region.

In some embodiments, a boundary of the touch insulating layer away from the display region, a boundary of the first insulating layer away from the display region, and a boundary of the third insulating layer away from the display region are arranged in a direction away from the display region;

wherein a boundary of the target protection layer away from the display region and a boundary of the third insulating layer away from the display region are collinear.

In some embodiments, a touch insulating layer, the first insulating layer, a second insulating layer, and a third insulating layer in the touch panel are all made of organic materials; and the target protection layer in the touch panel is made of an inorganic material.

In some embodiments, the display module includes a gate layer, an interlayer dielectric layer, a first source-drain layer, a first planarization layer, a second source-drain layer, and a second planarization layer that are disposed on a side of the base substrate and stacked in sequence; and the plurality of conductive patterns in each of the conductive pattern groups forming the connection interface include a gate pattern disposed in the gate layer, a first source-drain pattern disposed in the first source-drain layer, and a second source-drain pattern disposed in the second source-drain layer.

In another aspect, a method for preparing a touch panel is provided. The method includes:

forming an initial display module, forming the initial display module including: acquiring a base substrate having a display region and a peripheral region surrounding the display region, the peripheral region including a bonding region; forming a plurality of pixel units and a plurality of conductive pattern groups spaced apart on a side of the base substrate, wherein the plurality of pixel units are disposed in the display region, the plurality of conductive pattern groups are disposed in the bonding region, each of the conductive pattern groups includes a plurality of conductive patterns stacked in sequence, the plurality of conductive patterns in each of the conductive pattern groups forming a connection interface; and forming an initial encapsulation film layer on a side of the plurality of pixel units away from the base substrate, wherein the initial encapsulation film layer is configured to encapsulate the plurality of pixel units, and the initial encapsulation film layer includes an initial encapsulation layer, an orthographic projection of the initial encapsulation layer on the base substrate covering the display region and an orthographic projection of the connection interface on the base substrate;

forming a touch module on a side of the encapsulation film layer away from the initial display module;

forming a first insulating layer on a side of the touch module away from the initial display module, an orthographic projection of the first insulating layer on the base substrate covering the display region;

forming a color filter layer on a side of the touch module away from the initial display module; and acquiring an encapsulation film layer including a target encapsulation layer by etching the initial encapsulation layer, thereby acquiring a display module including the encapsulation film layer, wherein the target encapsulation layer is configured to expose a signal reception portion of the connection interface, the signal reception portion being connected to a driver circuit in the touch panel to receive a driving signal provided by the driver circuit.

In some embodiments, the plurality of connection interfaces includes a plurality of touch interfaces, wherein each of the touch interfaces includes a signal reception portion and a signal transmission portion, the signal transmission portion being close to the display region relative to the signal reception portion;

the initial encapsulation layer has a plurality of third openings, wherein an orthographic projection of each of the third openings on the base substrate at least partially overlaps an orthographic projection of the signal transmission portion on the base substrate to expose at least a partial region of one signal transmission portion;

forming the touch module includes: forming a first touch layer, a touch insulating layer, and a second touch layer in sequence on a side of the encapsulation film layer away from the base substrate;

wherein the first touch layer includes a plurality of first touch connection patterns disposed in the bonding region, a first touch connection pattern and the signal transmission portion being connected through a third opening; the touch insulating layer has a plurality of second openings, an orthographic projection of each of the second openings on the base substrate partially overlapping an orthographic projection of the first touch connection pattern on the base substrate; and the second touch layer includes a plurality of second touch connection patterns, a second touch connection pattern and the first touch connection pattern being connected through the third opening.

In some embodiments, a boundary of the third opening away from the display region and a boundary of the target encapsulation layer away from the display region are collinear; and a boundary of the second opening away from the display region and a boundary of the touch insulating layer away from the display region are collinear; and a boundary of the second touch connection pattern away from the display region disposed on a side, close to the display region, of a boundary of the first insulating layer away from the display region.

In yet another aspect, a method for preparing a touch panel is provided. The method includes:

forming a display module, wherein forming the display module includes: acquiring a base substrate having a display region and a peripheral region surrounding the display region, the peripheral region including a bonding region; forming a plurality of pixel units and a plurality of conductive pattern groups spaced apart on a side of the base substrate, wherein the plurality of pixel units are disposed in the display region, the plurality of conductive pattern groups are disposed in the bonding region, each of the conductive pattern groups includes a plurality of conductive patterns stacked in sequence, the plurality of conductive patterns in each of the conductive pattern groups forming a connection interface; and forming an encapsulation film layer on a side of the plurality of pixel units away from the base substrate, wherein the encapsulation film layer is configured to encapsulate the plurality of pixel units, and a boundary of the encapsulation film layer is disposed between the connection interface and the display region;

forming a touch module on a side of the display module;

forming an initial protection layer on a side of the touch module away from the base substrate, an orthographic projection of the initial protection layer on the base substrate covering an orthographic projection of the connection interface on the base substrate;

forming a first insulating layer on a side of the initial protection layer away from the display module, an orthographic projection of the first insulating layer on the base substrate covering the display region;

forming a color filter layer on a side of the first insulating layer away from the display module; and acquiring a target protection layer by etching the initial protection layer, wherein the target protection layer is configured to expose a signal reception portion of the connection interface, the signal reception portion being connected to a driver circuit in the touch panel to receive a driving signal provided by the driver circuit.

In some embodiments, forming the touch module includes: forming a first touch layer, a touch insulating layer, and a second touch layer in sequence on a side of the encapsulation film layer away from the base substrate;

the first touch layer includes a plurality of first touch connection patterns disposed in the bonding region, each of the first touch connection patterns being in contact with a conductive pattern, furthest from the base substrate, of a connection interface;

the touch insulating layer has a plurality of second openings, an orthographic projection of each of the second openings on the base substrate partially overlapping an orthographic projection of one of the first touch connection patterns on the base substrate, and the second openings being configured to expose a portion of one of the first touch connection patterns; and the second touch layer includes a plurality of second touch connection patterns disposed in the bonding region, each of the second touch connection patterns and one of the first touch connection patterns being connected through a second opening;

wherein the conductive pattern groups forming the connection interface further includes one of the first touch connection patterns and one of the second touch connection patterns.

In some embodiments, the touch module includes a first touch electrode and a second touch electrode disposed in the display region and insulated from each other;

the first touch layer further includes a plurality of first touch connection lines corresponding to the plurality of first touch connection patterns, one end of each of the first touch connection lines being connected to a corresponding first touch connection pattern, and another end of each of the first touch connection lines being connected to the first touch electrode or the second touch electrode; and the second touch layer includes a plurality of second touch connection lines corresponding to the plurality of second touch connection patterns, one end of each of the second touch connection lines being connected to a corresponding second touch connection pattern, and another end of each of the second touch connection lines being connected to the first touch electrode or the second touch electrode.

In some embodiments, before forming the touch module, the method further includes:

forming a second insulating layer on a side of the encapsulation film layer away from the base substrate, wherein an orthographic projection of the second insulating layer on the base substrate covers the display region, and a boundary of the second insulating layer is disposed between the connection interface and the display region.

In yet another aspect, a touch panel is provided. The touch panel includes: a display module, a target protection layer, a touch module, a first insulating layer, and a color filter layer; wherein the target protection layer is disposed between the display module and the touch module or disposed on a side of the touch module away from the display module; the first insulating layer is disposed on the side of the touch module away from the display module, and the color filter layer is disposed on a side of the first insulating layer away from the display module; and the display module includes:

a base substrate, wherein the base substrate has a display region and a peripheral region surrounding the display region, the peripheral region including a bonding region;

a plurality of pixel units disposed on a side of the base substrate and in the display region;

a plurality of conductive pattern groups disposed on a side of the base substrate and spaced apart, wherein the plurality of conductive pattern groups are disposed in the bonding region, each of the conductive pattern groups includes a plurality of conductive patterns stacked in sequence, and each of the conductive pattern groups includes a plurality of conductive patterns for forming a connection interface; and an encapsulation film layer disposed on a side of the plurality of pixel units away from the base substrate, wherein the encapsulation film layer is configured to encapsulate the plurality of pixel units, and a boundary of the encapsulation film layer is disposed between the connection interface and the display region;

wherein an orthographic projection of the target protection layer on the base substrate does not overlap an orthographic projection of a signal reception portion of the connection interface on the base substrate, the signal reception portion being connected to a driver circuit in the touch panel to receive a driving signal provided by the driver circuit; and an orthographic projection of the first insulating layer on the base substrate covers the display region.

In some embodiments, the touch module includes a first touch layer, a touch insulating layer, and a second touch layer stacked in sequence;

the touch panel further includes a second insulating layer disposed between the target protection layer and the touch module; and the color filter layer includes a black matrix structure, a plurality of first color resist blocks of a first color, a plurality of second color resist blocks of a second color, a plurality of third color resist blocks of a third color, and a third insulating layer, wherein the plurality of first color resist blocks of the first color, the plurality of second color resist blocks of the second color, and the plurality of third color resist blocks of the third color are disposed in a same layer and spaced apart, the black matrix structure is disposed between adjacent color resist blocks, and the third insulating layer is disposed on a side of the black matrix structure and color resist blocks away from the display module.

In some embodiments, the first insulating layer, the second insulating layer, the third insulating layer, and the touch insulating layer are made of organic materials; and a material of the target protection layer is made of an inorganic material.

In some embodiments, the plurality of connection interfaces includes a plurality of touch interfaces, wherein each of the touch interfaces includes a signal reception portion and a signal transmission portion, the signal transmission portion being close to the display region relative to the signal reception portion;

the target protection layer further includes a plurality of first openings, wherein an orthographic projection of each of the first openings on the base substrate at least partially overlaps an orthographic projection of the signal transmission portion on the base substrate to expose at least a partial region of one signal transmission portion; and the first touch layer includes a plurality of first touch connection patterns disposed in the bonding region, a first touch connection pattern and the signal transmission portion being connected through a first opening; the touch insulating layer has a plurality of second openings, an orthographic projection of each of the second openings on the base substrate partially overlapping an orthographic projection of the first touch connection pattern on the base substrate; and the second touch layer includes a plurality of second touch connection patterns disposed in the bonding region, a second touch connection pattern and the first touch connection pattern being connected through a second opening.

In some embodiments, the touch module includes a first touch electrode and a second touch electrode disposed in the display region and insulated from each other;

the first touch layer further includes a plurality of first touch connection lines corresponding to the plurality of first touch connection patterns, one end of each of the first touch connection lines being connected to a corresponding first touch connection pattern, and another end of each of the first touch connection lines being connected to the first touch electrode or the second touch electrode; and the second touch layer includes a plurality of second touch connection lines corresponding to the plurality of second touch connection patterns, one end of each of the second touch connection lines being connected to a corresponding second touch connection pattern, and another end of each of the second touch connection lines being connected to the first touch electrode or the second touch electrode.

In some embodiments, a boundary of the first opening away from the display region and a boundary of the target protection layer away from the display region are collinear; and a boundary of the second opening away from the display region and a boundary of the touch insulating layer away from the display region are collinear; and a boundary of the second touch connection pattern away from the display region is disposed on a side, close to the display region, of a boundary of the first insulating layer away from the display region.

In some embodiments, the orthographic projection of the first opening on the base substrate (111) is disposed within the orthographic projection of the second opening on the base substrate, and an area of the orthographic projection of the first opening on the base substrate is less than an area of the orthographic projection of the second opening on the base substrate; or, the orthographic projection of the second opening on the base substrate is disposed within the orthographic projection of the first opening on the base substrate, and an area of the orthographic projection of the second opening on the base substrate is less than the orthographic projection of the first opening on the base substrate.

In some embodiments, a boundary of the touch insulating layer away from the display region, a boundary of the first insulating layer away from the display region, and a boundary of the third insulating layer away from the display region are arranged in a direction away from the display region;

wherein a boundary of the target protection layer away from the display region and a boundary of the third insulating layer away from the display region are collinear.

In some embodiments, the display module includes a gate layer, an interlayer dielectric layer, a first source-drain layer, a first planarization layer, a second source-drain layer, and a second planarization layer that are disposed on a side of the base substrate and stacked in sequence; and the plurality of conductive patterns in each of the conductive pattern groups forming the connection interface include a gate pattern disposed in the gate layer, a first source-drain pattern disposed in the first source-drain layer, and a second source-drain pattern disposed in the second source-drain layer.

In some embodiments, the second planarization layer has a second via, the second via being configured for connecting a second source-drain pattern to a first touch connection pattern of the first touch layer in the touch module;

an orthographic projection of a first opening in the target protection layer on the base substrate and an orthographic projection of a second opening in a touch insulating layer included in the touch module on the base substrate are disposed within an orthographic projection of the second via on the base substrate; and a boundary of the second via close to the display region is disposed on a side of a boundary of the touch insulating layer close to the display region, and a boundary of the second via away from the display region is disposed on a side of a boundary of the target protection layer away from the display region.

In some embodiments, the target protection layer further includes a fourth opening, wherein an orthographic projection of the fourth opening covers the display region to expose the display region.

In yet another aspect, a touch panel is provided. The touch panel includes a display module, a touch module, a first insulating layer, and a color filter layer; wherein the touch module is disposed on a side of the display module; the first insulating layer is disposed on a side of the touch module away from the display module, and a color filter layer is disposed on a side of the first insulating layer away from the display module; and the display module includes:

a base substrate, wherein the base substrate has a display region and a peripheral region surrounding the display region the peripheral region including a bonding region;

a plurality of pixel units disposed on a side of the base substrate and in the display region;

a plurality of conductive pattern groups disposed on a side of the base substrate and spaced apart, wherein the plurality of conductive pattern groups are disposed in the bonding region, each of the conductive pattern groups includes a plurality of conductive patterns stacked in sequence, and each of the conductive pattern groups includes a plurality of conductive patterns for forming a connection interface; and an encapsulation film layer disposed on a side of the plurality of pixel units away from the base substrate, wherein the encapsulation film layer is configured to encapsulate the plurality of pixel units, and the encapsulation film layer at least includes a target encapsulation layer, wherein an orthographic projection of the target encapsulation layer on the base substrate does not overlap an orthographic projection of a signal reception portion of the connection interface on the base substrate, the signal reception portion being connected to a driver circuit in the touch panel to receive a driving signal provided by the driver circuit.

In some embodiments, the touch module includes a first touch layer, a touch insulating layer, and a second touch layer stacked in sequence;

the touch panel further includes a second insulating layer disposed between the display module and the touch module; and the color filter layer includes a black matrix structure, a plurality of first color resist blocks of a first color, a plurality of second color resist blocks of a second color, a plurality of third color resist blocks of a third color, and a third insulating layer, wherein the plurality of first color resist blocks of the first color, the plurality of second color resist blocks of the second color, and the plurality of third color resist blocks of the third color are disposed in a same layer and spaced apart, the black matrix structure is disposed between adjacent color resist blocks, and the third insulating layer is disposed on a side of the black matrix structure and color resist blocks away from the display module.

In some embodiments, the first insulating layer, the second insulating layer, the third insulating layer, and the touch insulating layer are made of organic materials; and the target encapsulation layer is made of an inorganic material.

In some embodiments, the plurality of connection interfaces includes a plurality of touch interfaces, wherein each of the touch interfaces includes a signal reception portion and a signal transmission portion, the signal transmission portion being close to the display region relative to the signal reception portion;

the target encapsulation layer further includes a plurality of third openings, wherein an orthographic projection of each of the third openings on the base substrate at least partially overlaps an orthographic projection of the signal transmission portion on the base substrate to expose at least a partial region of one signal transmission portion; and the first touch layer includes a plurality of first touch connection patterns disposed in the bonding region, a first touch connection pattern and the signal transmission portion being connected through a first opening; the touch insulating layer has a plurality of second openings, an orthographic projection of each of the second openings on the base substrate partially overlapping an orthographic projection of the first touch connection pattern on the base substrate; and the second touch layer includes a plurality of second touch connection patterns disposed in the bonding region, a second touch connection pattern and the first touch connection pattern being connected through a second opening.

In some embodiments, the touch module includes a first touch electrode and a second touch electrode disposed in the display region and insulated from each other;

the first touch layer further includes a plurality of first touch connection lines corresponding to the plurality of first touch connection patterns, one end of each of the first touch connection lines being connected to a corresponding first touch connection pattern, and another end of each of the first touch connection lines being connected to the first touch electrode or the second touch electrode; and the second touch layer includes a plurality of second touch connection lines corresponding to the plurality of second touch connection patterns, one end of each of the second touch connection lines being connected to a corresponding second touch connection pattern, and another end of each of the second touch connection lines being connected to the first touch electrode or the second touch electrode.

In some embodiments, a boundary of the third opening away from the display region and a boundary of the target encapsulation layer away from the display region are collinear; and a boundary of the second opening away from the display region and a boundary of the touch insulating layer away from the display region are collinear; and a boundary of the second touch connection pattern away from the display region disposed on a side, close to the display region, of a boundary of the first insulating layer away from the display region.

In some embodiments, the orthographic projection of the first opening on the base substrate is disposed within the orthographic projection of the second opening on the base substrate, and an area of the orthographic projection of the first opening on the base substrate is less than an area of the orthographic projection of the second opening on the base substrate; or, the orthographic projection of the second opening on the base substrate is disposed within the orthographic projection of the first opening on the base substrate, and an area of the orthographic projection of the second opening on the base substrate is less than the orthographic projection of the first opening on the base substrate.

In some embodiments, a boundary of the touch insulating layer away from the display region, a boundary of the first insulating layer away from the display region, and a boundary of the third insulating layer away from the display region are arranged in a direction away from the display region;

wherein a boundary of the target encapsulation layer away from the display region and a boundary of the third insulating layer away from the display region are collinear.

In some embodiments, the display module includes a gate layer, an interlayer dielectric layer, a first source-drain layer, a first planarization layer, a second source-drain layer, and a second planarization layer that are disposed on a side of the base substrate and stacked in sequence; and the plurality of conductive patterns in each of the conductive pattern groups forming the connection interface include a gate pattern disposed in the gate layer, a first source-drain pattern disposed in the first source-drain layer, and a second source-drain pattern disposed in the second source-drain layer.

In some embodiments, the second planarization layer has a second via, the second via being configured for connecting a second source-drain pattern to a first touch connection pattern of the first touch layer in the touch module;

an orthographic projection of a third opening in the target encapsulation layer on the base substrate, and an orthographic projection of a second opening in a touch insulating layer included in the touch module on the base substrate are disposed within an orthographic projection of the second via on the base substrate; and a boundary of the second via close to the display region is disposed on a side of a boundary of the touch insulating layer close to the display region, and a boundary of the second via away from the display region is disposed on a boundary of the target encapsulation layer away from the display region.

In yet another aspect, a touch device is provided. The touch device includes a power supply assembly and the touch panel as described above;

wherein the power supply assembly is configured to power the touch panel.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

DETAILED DESCRIPTION

To make the objective, technical solutions, and advantages of the present disclosure clearer, embodiments of the present disclosure will be further described in detail referring to the accompanying drawings.

In the related art, in order to improve the transmittance of the touch panel and make the touch panel thinner, a solution for no polarizer (POL) is used, for example, a color filter on encapsulation (COE) technology is applied in the display module included in the touch panel. Moreover, in order to improve the bending performance of the touch panel, the inorganic layer in the touch panel is usually replaced with the organic layer. However, as the organic layer is easily absorbable by water, the organic layer disposed in the bonding region of the touch panel needs to be removed to avoid water and oxygen corrosion. Therefore, the plurality of connection interfaces disposed in the bonding region of the touch panel cannot be protected by the protective film layer, i.e., the plurality of connection interfaces are exposed.

However, when each film layer included in the color filter layer is formed, etching needs to be performed by the developer, and as the plurality of connection interfaces are exposed, the developer may etch a portion of the film layer of the connection interfaces, which easily leads to shorting of adjacent connection interfaces, and the yield of the touch panel is poor.

Figure 1:
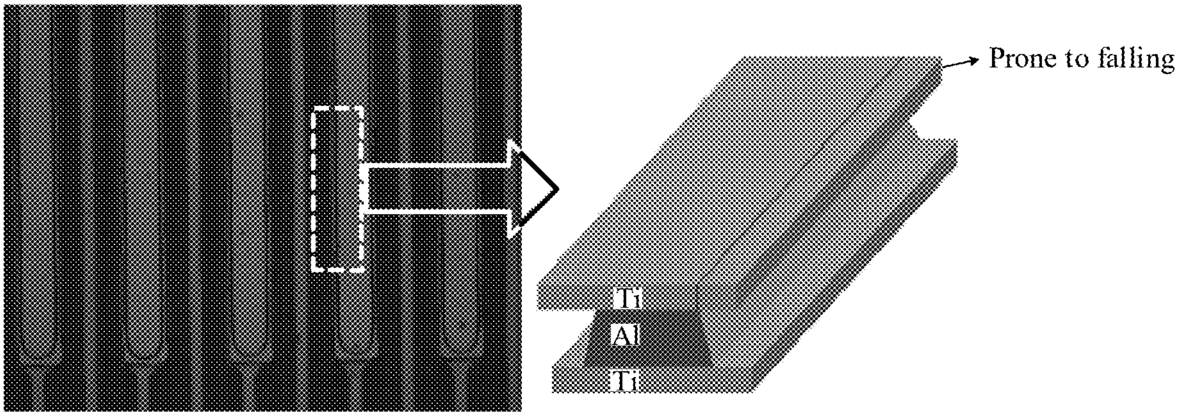
FIG. 1 is a schematic diagram of a connection interface side etching in the prior art according to some embodiments of the present disclosure.

In the related art, a top layer pattern of the connection interface included in the touch panel is usually composed of a triple-stacked layer structure, for example, including a titanium (Ti) layer, an aluminum (Al) layer, and a Ti layer stacked in sequence, and the top layer pattern is completely exposed. Therefore, during the formation of the individual structures in the color filter layer, the top layer pattern of the connection interface needs to be washed through the developer. As the developer is alkaline, the Al layer in the top layer pattern may be corroded, and the top layer pattern of the connection interface is side-etched (undercut structure). As shown in FIG. 1, after the Al layer is side-etched, the Ti layer on the surface, which is not supported, may break during the subsequent bonding process of the flexible circuit board and the connection interface, causing poor bonding. Further, the adjacent connection interfaces may be shorted through the dropped Ti layer, and the yield of the touch panel is poor.

Figure 2:
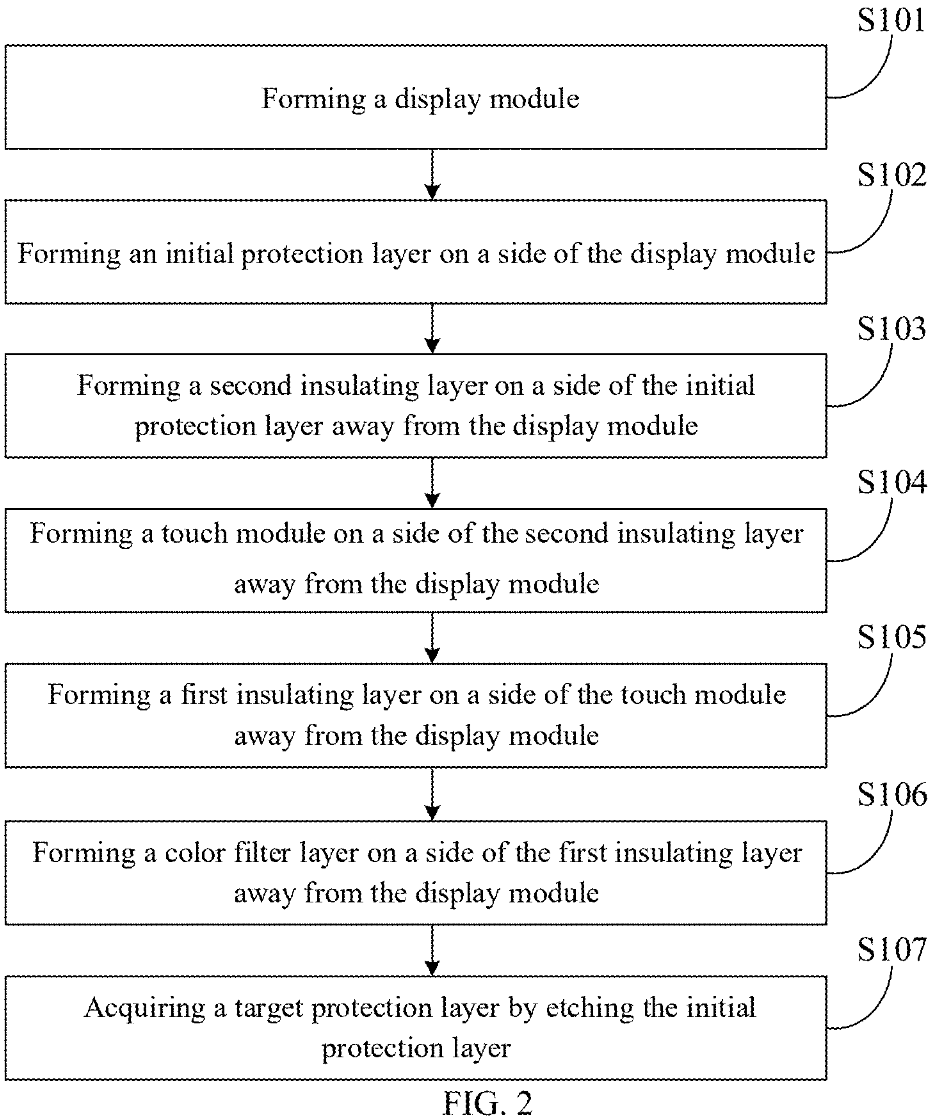
FIG. 2 is a flowchart of a method for preparing a touch panel according to some embodiments of the present disclosure.

FIG. 2 is a flowchart of a method for preparing a touch panel according to some embodiments of the present disclosure. Referring to FIG. 2, the method includes the following steps.

In step S101, a display module is formed.

In the embodiments of the present disclosure, the display module 11 may be a flexible display module to enable folding of the display module 11. In some embodiments, the display module 11 may be an organic light-emitting diode (OLED) display module 11.

Figures 3, 4:
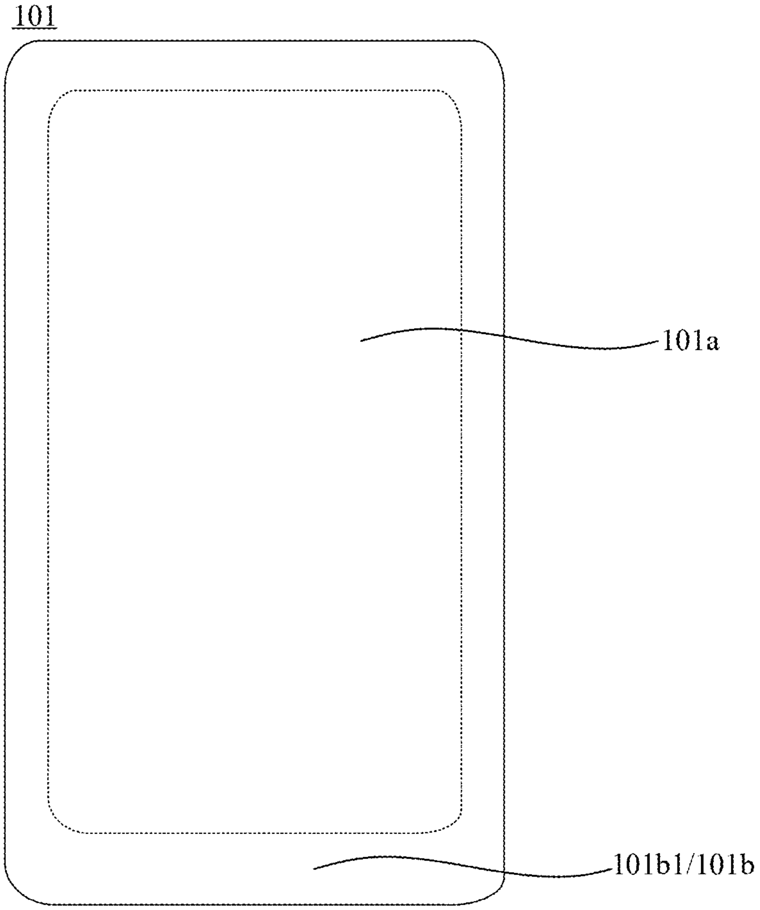
FIG. 3 is a flowchart of a method for preparing a display module according to some embodiments of the present disclosure.
FIG. 4 is a schematic structural diagram of a base substrate according to some embodiments of the present disclosure.

Referring to FIG. 3, the process of forming the display module 11 includes the following steps.

In step S1011, a base substrate is acquired.

In the embodiments of the present disclosure, when forming the display module 11, a base substrate 111 may be acquired first, which in turn may facilitate the formation of a plurality of pixel units for emitting light and a plurality of connection interfaces G for transmitting signals on the base substrate 111. The base substrate 111 may be a flexible substrate, for example, the material of the base substrate 111 may be a polyimide (PI).

Referring to FIG. 4, the base substrate 111 has a display region 111*a* and a peripheral region 111*b* surrounding the display region 111*a*. The peripheral region 111*b* includes at least a bonding region 111*b*1. The bonding region 111*b*1 may be a region of the peripheral region 111*b* disposed on the lower side of the display region 111*a*, and the bonding region 111*b*1 may be used to enable the flexible circuit board and the display module 11 to be bound.

In step S1012, a plurality of pixel units and a plurality of conductive pattern groups spaced apart are formed on a side of the base substrate.

The plurality of pixel units are disposed in the display region 111*a* of the base substrate 111 for emitting light. The plurality of conductive pattern groups are disposed in the bonding region 111*b*1 of the peripheral region 111*b* of the base substrate 111. Each conductive pattern group includes a plurality of conductive patterns stacked in sequence, and the plurality of conductive patterns included in each conductive pattern group is used to form one connection interface G. That is, the number of connection interfaces G formed may be the same as the number of conductive pattern groups included in the display module 11.

In some embodiments, the plurality of pixel units included in the display module 11 include a plurality of film layers. The plurality of film layers at least include a film layer where the plurality of conductive patterns forming the connection interface G are disposed. As a result, the plurality of conductive patterns can be formed synchronously in the process of forming the plurality of pixel units.

In step S1013, an encapsulation film layer is formed on a side of the plurality of pixel units away from the base substrate.

In the embodiments of the present disclosure, the encapsulation film layer can be used to encapsulate the plurality of pixel units, and the boundary of the encapsulation film layer is disposed between the connection interface G and the display region 111*a*. That is, the plurality of connection interfaces G can be exposed from the encapsulation film layer.

In some embodiments, the encapsulation film layer includes a first encapsulation layer, a second encapsulation layer, and a third encapsulation layer that are stacked in a direction away from the base substrate 111.

In some embodiments, the first encapsulation layer and the third encapsulation layer may be made of an inorganic material and the second encapsulation layer may be made of an organic material. For example, the first encapsulation layer and the third encapsulation layer may be made of one or more inorganic oxides such as silicon nitride (SiNx), silicon oxide (SiOx), and silicon nitride oxide (SiOxNy). The second encapsulation layer may be made of a resin material. The resin may be a thermoplastic resin or a thermosetting resin, the thermoplastic resin may include an acrylic (PMMA) resin, and the thermosetting resin may include an epoxy resin.

In the embodiments of the present disclosure, the second encapsulation layer may be prepared by using ink jet printing (IJP). The first encapsulation layer and the third encapsulation layer may be prepared by using a chemical vapor deposition (CVD).

As the material of the second encapsulation layer is easily absorbable by water, in order to avoid corrosion of the plurality of pixel units in the final formed touch panel by water and oxygen, the boundary of the second encapsulation layer needs to be closer to the display region 111*a* than the boundary of the first encapsulation layer (or the third encapsulation layer). In some embodiments, the boundary of the first encapsulation layer and the boundary of the third encapsulation layer may be collinear.

The boundary of the encapsulation film layer may refer to a boundary of the first encapsulation layer and a boundary of the third encapsulation layer that is further away from the display region 111*a*. Exemplarily, assuming that the boundary of the first encapsulation layer is further away from the display region 111*a* relative to the boundary of the third encapsulation layer, the boundary of the encapsulation film layer may refer to the boundary of the first encapsulation layer. Assuming that the boundary of the third encapsulation layer is further away from the display region 111*a* relative to the boundary of the first encapsulation layer, the boundary of the encapsulation film layer may refer to the boundary of the third encapsulation layer.

In step S102, an initial protection layer is formed on a side of the display module.

Figure 5:
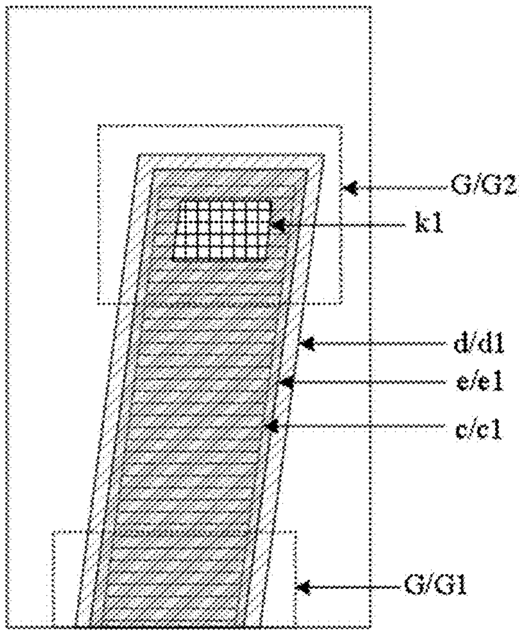
FIG. 5 is a schematic diagram of forming a first opening in an initial protection layer according to some embodiments of the present disclosure.

In the embodiments of the present disclosure, referring to FIG. 5, after forming the display module 11, the initial protection layer may be formed on the side of the display module 11 designed with the plurality of pixel units. An orthographic projection of the initial protection layer on the base substrate 111 covers an orthographic projection of the connection interface G on the base substrate 111.

In the embodiments of the present disclosure, in the plurality of connection interfaces G included in the display module 11, some of the connection interfaces G may be touch interfaces. The touch interface may be used to transmit a signal for a touch electrode in the touch panel.

For the touch interface, the touch interface includes a signal transmission portion G2 in addition to a signal reception portion G1, and the signal transmission portion G2 is disposed close to the display region 111*a* relative to the signal reception portion G1. The signal received by the signal reception portion G1 is transmitted to the touch electrode through the signal transmission portion G2. The touch electrode may be disposed in a first touch layer (TMA) 13*a*, and/or a second touch layer (TMB) 13*b* in the touch module 13.

In this implementation, the initial protection layer also has a plurality of first openings k1. An orthographic projection of each of the first openings k1 on the base substrate 111 at least partially overlaps an orthographic projection of the signal transmission portion G2 on the base substrate 111, so as to expose at least a partial region of one signal transmission portion G2 to allow the touch electrode in the subsequently-formed touch module 13 to be connected to the signal transmission portion G2 through the first opening k1. In order to facilitate the illustration of the first opening k1, a fill pattern is used to represent the first opening k1 in FIG. 5. Other regions where the fill pattern is not drawn are used to represent regions where the initial protection layer has a solid material.

In some embodiments, the process of forming the initial protection layer includes: forming an initial protective film (the initial protective film covers the entire layer of the base substrate 111), and patterning the initial protective film using a protection layer mask to obtain the initial protection layer. The patterning process includes: photoresist coating, exposure using the protection layer mask, developing, etching, and removing the photoresist.

The photoresist includes a positive photoresist and a negative photoresist. The positive photoresist may be used to make the shape of the final formed film layer the same as the mask. The negative photoresist may be used to make the shape of the final formed film layer opposite to the mask.

Taking the photoresist as a positive photoresist as an example, in order to make the formed initial protection layer expose at least a portion of the signal transmission portion G2 of the connection interface G, the protection layer mask may be designed with a mask opening, and an orthographic projection of the mask opening on the substrate 111 covers at least a portion of the signal transmission portion G2. As a result, when the protection layer mask is used to expose the positive photoresist, the positive photoresist disposed at the mask opening can be exposed. Further, the portion of the positive photoresist disposed at the mask opening can be removed in the developing process, and thus the portion of the initial protective film that is not protected by the positive photoresist (i.e., the first opening forming the initial protection layer) can be removed in the developing process.

At the same time, as an orthographic projection of the protection layer mask on the base substrate 111 covers the signal reception portion G1 of the connection interface G, the positive photoresist disposed at the signal reception portion G1 cannot be exposed when the positive photoresist is exposed using this protection layer mask. Further, the portion of the positive photoresist disposed at the signal reception portion G1 may remain in the developing process, and thus the portion of the initial protective film disposed at the signal reception portion G1 (i.e., the orthographic projection of the initial protection layer on the base substrate 111 covers an orthographic projection of the signal reception portion G1 of the connection interface G on the base substrate 111) may be remained in the developing process.

Figure 6:
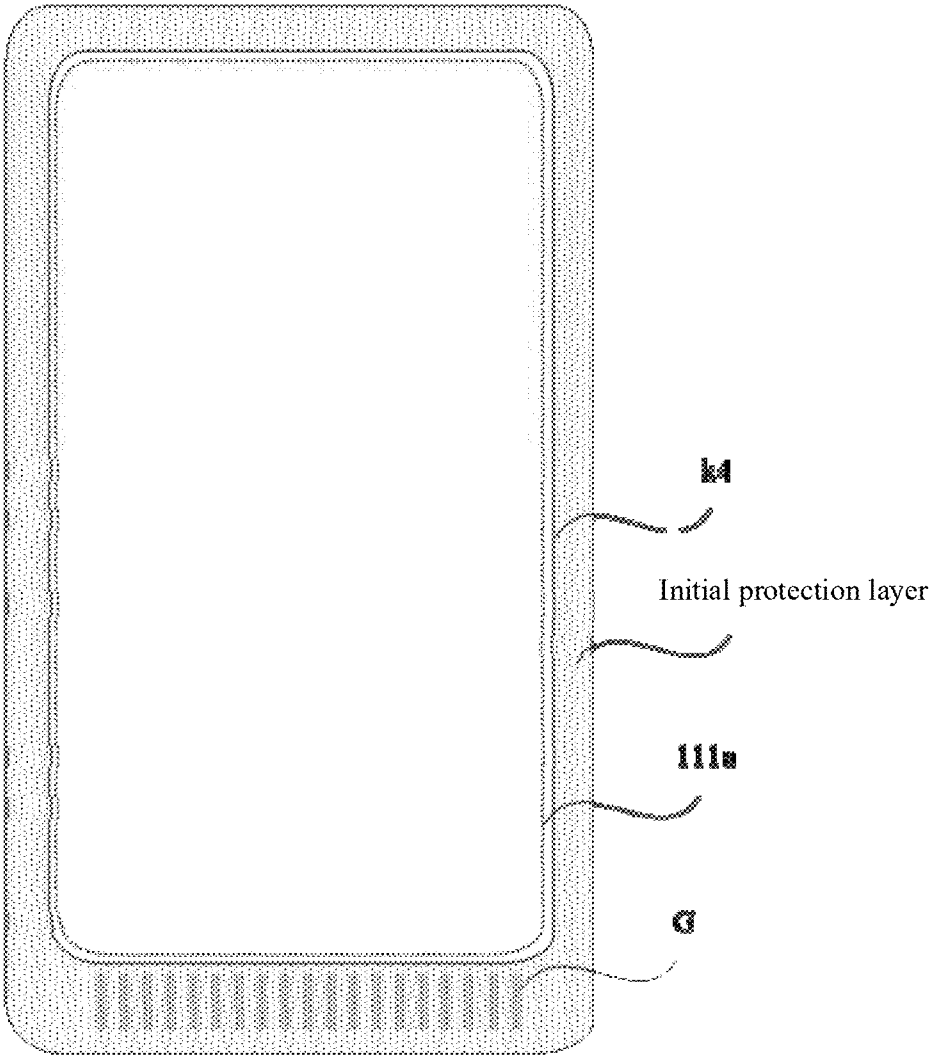
FIG. 6 is a schematic diagram of an initial protection layer and a connection interface according to some embodiments of the present disclosure.

In some embodiments, referring to FIG. 6, the initial protection layer may also have a fourth opening k4. An orthographic projection of the fourth opening k4 on the base substrate 111 covers the display region 111*a*. Therefore, the film layer thickness of the inorganic material (the material of the initial protection layer is an inorganic material) disposed at the display region 111*a* can be avoided from being too thick, and the bending performance of the touch panel can be improved.

In the case that the initial protection layer to be formed has a plurality of first openings k1 and a plurality of fourth openings k4, taking the photoresist as a positive photoresist as an example, the mask is designed to have a plurality of first mask opening and a second mask opening. An orthographic projection of the first mask opening on the base substrate 111 at least partially overlaps an orthographic projection of the signal transmission portion G2 on the base substrate 111. An orthographic projection of the second mask opening on the base substrate 111 covers the display region 111*a*.

In step S103, a second insulating layer is formed on a side of the initial protection layer away from the display module.

Figure 7:
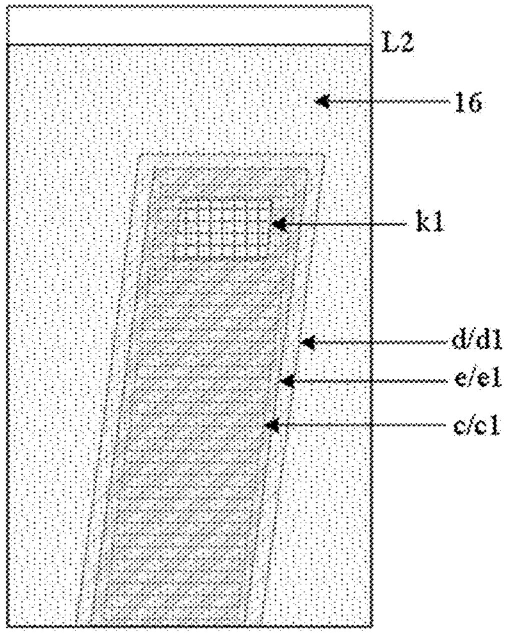
FIG. 7 is a schematic diagram of forming a second insulating layer according to some embodiments of the present disclosure.

In the embodiments of the present disclosure, referring to FIG. 7, an orthographic projection of the second insulating layer 16 on the base substrate 111 covers the display region 111*a* (i.e., the whole surface covers the display region), and the boundary L2 of the second insulating layer 16 is disposed between the connection interface G and the display region 111*a*. That is, the orthographic projection of the second insulating layer 16 on the base substrate 111 does not overlap the orthographic projection of the connection interface G on the base substrate 111, and the second insulating layer 16 may expose the connection interface G. To facilitate the illustration of the second insulating layer 16, a filler pattern is used to indicate a region of the second insulating layer 16 that is not designed for the second insulating layer 16 in FIG. 7, and other regions where the filler pattern is not drawn are used to indicate regions where the second insulating layer 16 has a solid material.

In some embodiments, the material of the second insulating layer 16 may be an organic material, such as an adhesive material (OC). The second insulating layer 16 may be used to protect the encapsulation film layer disposed in the display region 111*a*, to avoid over-etching of the initial protection layer or the encapsulation film layer by the developer during the subsequent formation of the film layer in the touch module 13, and thus to avoid crack of the film layer, and to ensure the bending effect of the display module 11.

It is noted that the process of forming the second insulating layer 16 includes: forming a second insulating film, and patterning the second insulating film using a second insulating mask to obtain the second insulating layer 16.

Taking the photoresist as a positive photoresist as an example, in order to enable the formed second insulating layer 16 to cover the display region 111*a* and expose the connection interface G, the orthographic projection of the second insulating mask on the base substrate 111 may cover the display region 111*a*, and the connection interface G is exposed.

In step S104, a touch module is formed on a side of the second insulating layer away from the display module.

In the embodiments of the present disclosure, the touch module 13 includes a first touch layer 13*a*, a touch insulating layer 13*c*, and a second touch layer 13*b* stacked in sequence. Therefore, the process of forming the touch module 13 includes: forming the first touch layer 13*a* on a side of the second insulating layer 16 away from the display module 11; forming the touch insulating layer 13*c* on a side of the first touch layer 13*a* away from the base substrate 111; and forming the second touch layer 13*b* on a side of the touch insulating layer 13*c* away from on the base substrate 111.

It is noted that the touch module 13 includes a first touch electrode 131 and a second touch electrode 132 disposed in the display region 111*a* and insulated from each other. One of the first touch electrode 131 and the second touch electrode 132 is a Transmit (Tx) electrode and the other touch electrode is a Receive (Rx) electrode.

Figure 8:
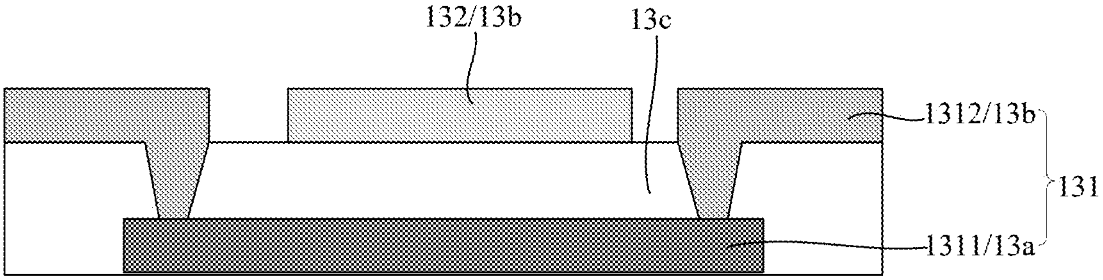
FIG. 8 is a schematic diagram of a touch module according to some embodiments of the present disclosure.

In some embodiments, referring to FIG. 8, the first touch electrode 131 includes a bridging electrode 1311 disposed in the first touch layer 13*a*, and a main electrode 1312 disposed in the second touch layer 13*b*, the bridging electrode 1311 and the main electrode 1312 being connected through a via in the touch insulating layer 13*c*. The second touch electrode 132 is disposed in the second touch layer 13*b*.

Figure 9:
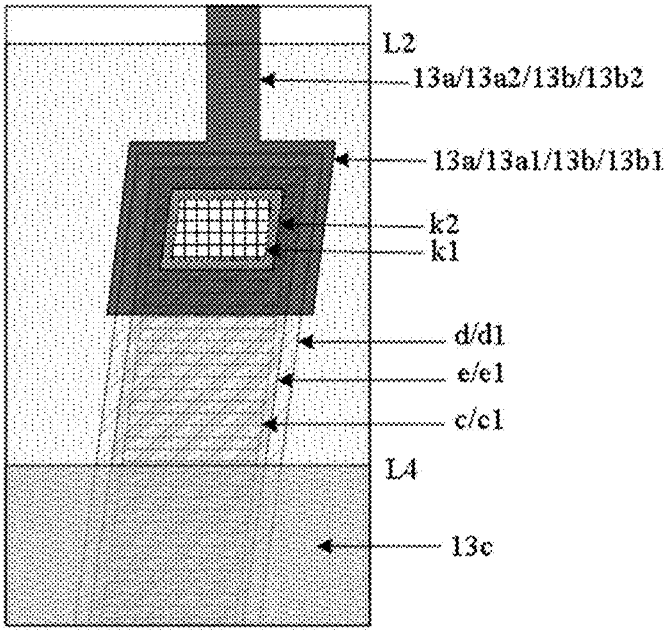
FIG. 9 is a schematic diagram of forming a touch module according to some embodiments of the present disclosure.

Referring to FIG. 9, the first touch layer 13*a* includes a plurality of first touch connection patterns 13*a*1 disposed in the bonding region 111*b*1 and a plurality of first touch connection lines 13*a*2 corresponding to the plurality of first touch connection patterns 13*a*1. Each first touch connection pattern 13*a*1 and the signal transmission portion G2 are connected through the first opening k1. One end of each first touch connection line 13*a*2 is connected to the corresponding one of the first touch connection patterns 13*a*1, and the other end of each first touch connection line 13*a*2 is connected to the first touch electrode 131 or the second touch electrode 132.

Referring to FIG. 9, the material of the touch insulating layer 13*c* may be an organic material, such as an adhesive material (OC). In order to avoid corrosion by water and oxygen, an orthographic projection of the touch insulating layer 13*c* on the base substrate 111 does not overlap the orthographic projection of the signal reception portion G1 of the connection interface G on the base substrate, i.e., the signal reception portion G1 is exposed from the touch insulating layer 13*c*.

Moreover, the touch insulating layer 13*c* has a plurality of second openings k2. An orthographic projection of each of the second openings k2 on the base substrate 111 partially overlaps an orthographic projection of the first touch connection pattern 13*a*1 on the base substrate 111. In order to facilitate the illustration of the touch insulating layer 13*c*, a fill pattern is used in FIG. 9 to indicate a region where the touch insulating layer 13*c* is not designed, and other regions where the fill pattern is not drawn are used to indicate regions where the touch insulating layer 13*c* has a solid material. Moreover, the first opening k1 is shown above the second opening k2 in FIG. 9 to indicate the design relationship between the first opening k1 and the second opening k2, and is shown using a dashed line.

The second touch layer 13*b* includes a plurality of second touch connection patterns 13*b*1 disposed in the bonding region 111*b*1 and a plurality of second touch connection lines 13*b*2 corresponding to the plurality of second touch connection patterns 13*b*1. Each of the second touch connection patterns 13*b*1 is connected to one first touch connection pattern 13*a*1 through the second opening k2. One end of each second touch connection line 13*b*2 is connected to the corresponding one of the second touch connection patterns 13*b*1, and the other end is connected to the first touch electrode 131 or the second touch electrode 132.

That is, in the embodiments of the present disclosure, after the signal reception portion G1 of the touch interface receives the signal, the signal can be transmitted to the first touch connection pattern **13*a*1 and the second touch connection pattern 13*b*1 through the signal transmission portion G2 of the touch interface, and thus to the first touch connection line 13*a*2 and the second touch connection line 13*b*2. Further, as the first touch connection line 13*a*2 and the second touch connection line 13*b*2 are connected to the touch electrode, the received signal can be transmitted to the touch electrode, thereby realizing the touch function of the touch panel 1**.

Figure 10:
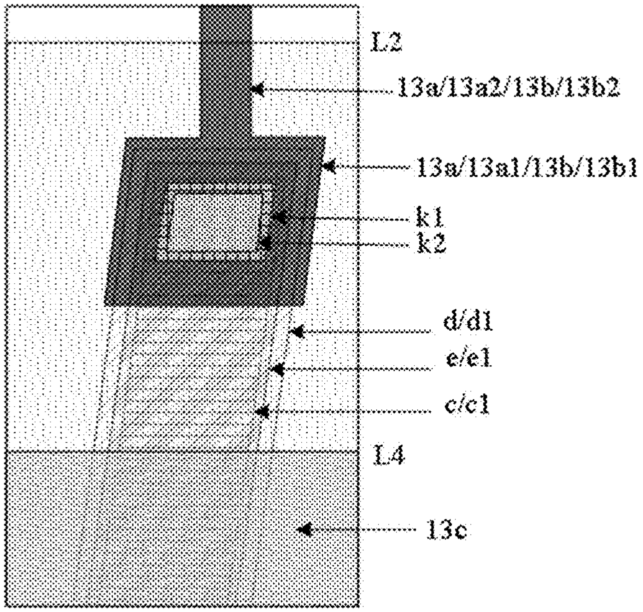
FIG. 10 is another schematic diagram of forming a touch module according to some embodiments of the present disclosure.

In the embodiments of the present disclosure, referring to FIG. 9, an orthographic projection of the first opening k1 on the base substrate 111 is disposed within an orthographic projection of the second opening k2 on the base substrate 111, and an area of the orthographic projection of the first opening k1 on the base substrate 111 is less than an area of the orthographic projection of the second opening k2 on the base substrate 111. Alternatively, referring to FIG. 10, the orthographic projection of the second opening k2 on the base substrate 111 is disposed within the orthographic projection of the first opening k1 on the base substrate 111, and the area of the orthographic projection of the second opening k2 on the base substrate 111 is less than the area of the orthographic projection of the first opening k1 on the base substrate 111. That is, the embodiments of the present disclosure do not limit the size relationship between the first opening k1 and the second opening k2, but only realize the reliable transmission of the signal.

In the embodiments of the present disclosure, the formation process of the first touch layer **13*a* included in the touch module 13 includes: forming a first touch film, and patterning the first touch film using a first touch mask to obtain the first touch layer 13*a*. The formation process of the touch insulating layer 13*c* included in the touch module 13 includes: forming a touch insulating film, and patterning the touch insulating film using a touch insulating mask to obtain the touch insulating layer 13*c*. The formation process of the second touch layer 13*b* included in the touch module 13 includes: forming a second touch film, and patterning the second touch film using a second touch mask to obtain the second touch layer 13*b***.

Taking the photoresist used in the patterning process as a positive photoresist as an example: the first touch mask may have an opening for forming a bridging electrode, an opening for forming the first touch connection pattern **13*a*1, and an opening for forming the first touch connection line 13*a*2; the touch insulating mask has an opening for forming a second opening k2, and an opening for forming a via for connecting a bridging electrode and main electrode; and the second touch mask plate may have an opening for forming the main electrode, an opening for forming the second touch electrode 132, an opening for forming the second touch connection pattern 13*b*1, and an opening for forming the second touch connection line 13*b*2**.

In step S105, a first insulating layer is formed on a side of the touch module away from the display module.

Figure 11:
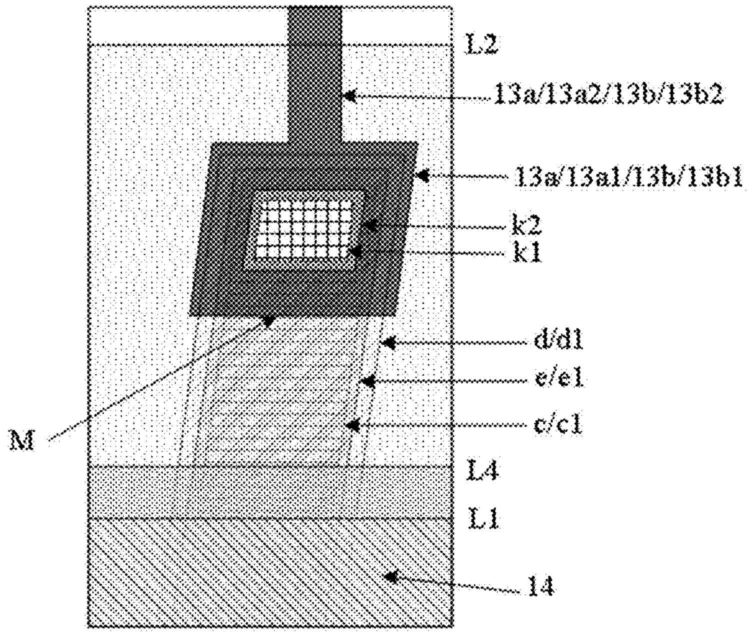
FIG. 11 is a schematic diagram of forming a first insulating layer according to some embodiments of the present disclosure.

In the embodiments of the present disclosure, referring to FIG. 11, an orthographic projection of the first insulating layer 14 on the base substrate 111 covers the display region **111*a*. The first insulating layer 14 may be used to protect the display region 111*a*. Moreover, the surface of this first insulating layer 14 away from the display module 11 may be a flat surface for the subsequent formation of the color filter layer 15**.

In some embodiments, the process of forming the first insulating layer 14 includes: forming a first insulating film, and patterning the first insulating film using a first insulating mask to obtain the first insulating layer 14.

In the case that the display module 11 includes a touch interface, in order to avoid the subsequent formation of the color filter layer 15 from affecting the second touch connection pattern **13*b*1 disposed in the second touch layer 13*b*, an orthographic projection of the first insulating layer 14 on the base substrate 111 may be made to cover an orthographic projection of the second touch connection pattern 13*b*1 on the base substrate 111. That is, the boundary M of the second touch connection pattern 13*b*1 away from the display region 111*a* is disposed on a side, close to the display region 111*a*, of a boundary L1 of the first insulating layer 14 away from the display region 111*a***.

In some embodiments, the material of the first insulating layer 14 may be an organic material, such as an adhesive material (OC). To avoid corrosion by water and oxygen, the orthographic projection of the first insulating layer 14 on the base substrate 111 does not overlap the orthographic projection of the signal reception portion G1 of the connection interface G on the base substrate, i.e., the signal reception portion G1 is exposed from the first insulating layer 14.

In step S106, a color filter layer is formed on a side of the first insulating layer away from the display module.

Figure 12:
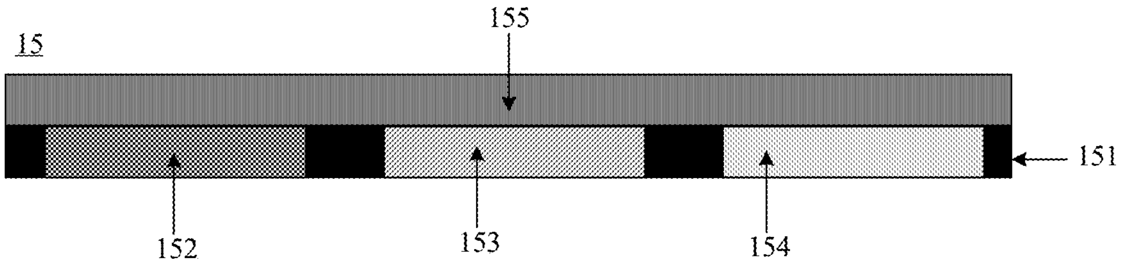
FIG. 12 is a schematic diagram of a color filter layer according to some embodiments of the present disclosure.

In the embodiments of the present disclosure, referring to FIG. 12, the color filter layer 15 includes a black matrix structure 151, a plurality of first color resist blocks 152 of a first color, a plurality of second color resist blocks 153 of a second color, a plurality of third color resist blocks 154 of a third color, and a third insulating layer 155. One first color resistor 152, one second color resistor 153, and one third color resistor 154 are shown in FIG. 12. The first color may be red, the second color may be green, and the third color may be blue. That is, the first color resist block 152 is a red color resist block for transmitting red light, the second color resist block 153 is a green color resist block for transmitting green light, and the third color resist block 154 is a blue color resist block for transmitting blue light.

The process of forming the color filter layer 15 includes: forming a black matrix structure 151; forming a plurality of first color resist blocks 152; forming a plurality of second color resist blocks 153; forming a plurality of third color resist blocks 154; and forming a third insulating layer 155.

The process of forming the black matrix structure 151 includes: forming a black matrix film; and patterning the black matrix film using a first mask to obtain the black matrix structure 151. The black matrix structure 151 has a plurality of hollowed-out regions, each hollowed-out region being used to form a color resist block.

The process of forming the plurality of first color resist blocks 152 includes: forming a first color resist film; and patterning the first color resist film using a second mask to obtain the plurality of first color resist blocks 152. Each of the first color resist blocks 152 is disposed in one hollowed-out region.

The process of forming the plurality of second color resist blocks 153 includes: forming a second color resist film; and patterning the second color resist film using a third mask to obtain the plurality of second color resist blocks 153. Each of the second color resist blocks 153 is disposed in one hollowed-out region.

The process of forming the plurality of third color resist blocks 154 includes: forming a third color resist film; and patterning the third color resist film using a fourth mask to obtain the plurality of third color resist blocks 154. Each of the third color resists 154 is disposed in one hollowed-out region.

The process of forming the third insulating layer 155 includes: forming a third insulating film; and patterning the third insulating film using a fifth mask to obtain the third insulating layer 155. An orthographic projection of the third insulating layer 155 on the base substrate 111 covers the display region 111*a*, and a boundary L3 of the third insulating layer 155 away from the display region 111*a* is further away from the display region 111*a* relative to the boundary L1 of the first insulating layer 14 away from the display region 111*a*. In order to facilitate the illustration of the third insulating layer 155, a fill pattern is used in FIG. 13 to indicate a region where the third insulating layer 155 is not designed, and other regions where the fill pattern is not drawn are used to indicate regions where the third insulating layer 155 has a solid material.

The material of the third insulating layer 155 may be an organic material, such as an adhesive material (OC). To avoid corrosion by water and oxygen, the orthographic projection of the third insulating layer 155 on the base substrate 111 does not overlap the orthographic projection of the signal reception portion G1 of the connection interface G on the base substrate, i.e., the signal reception portion G1 is exposed from the third insulating layer 155.

In the embodiments of the present disclosure, the developing process using the developer is required to form various structures included in the color filter layer 15. As the connection interface G is protected by the initial protection layer, the influence of the developing process on the connection interface G during the formation of the various structures included in the color filter layer 15 can be avoided. At the same time, in the case that the connection interface G (the touch interface) is connected to the first touch connection pattern disposed in the first touch layer 13*a* and the second touch connection pattern disposed in the second touch layer 13*b*, the first insulating layer 14 can protect the second touch connection pattern and prevent the connection interface G from being affected by the developing process performed to form various structure included in the color filter layer 15.

In step S107, a target protection layer is acquired by etching the initial protection layer.

Figure 13:
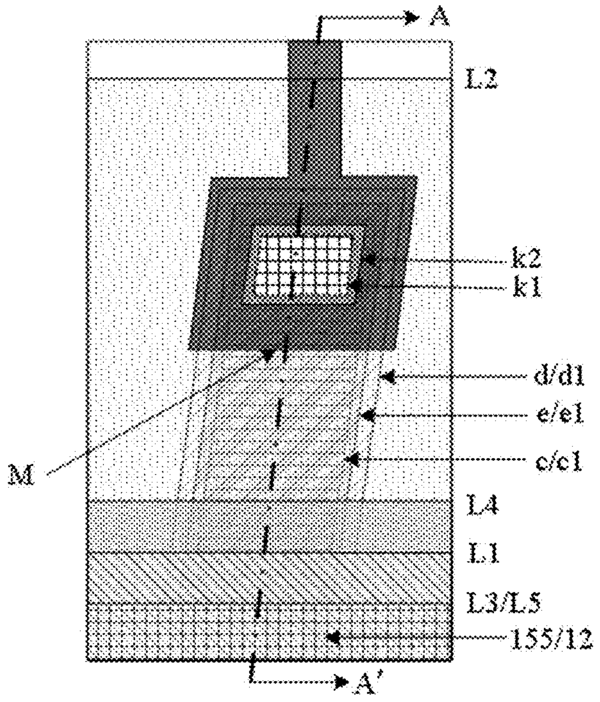
FIG. 13 is a schematic diagram of forming a third insulating layer and a target protection layer according to some embodiments of the present disclosure.
Figure 14:
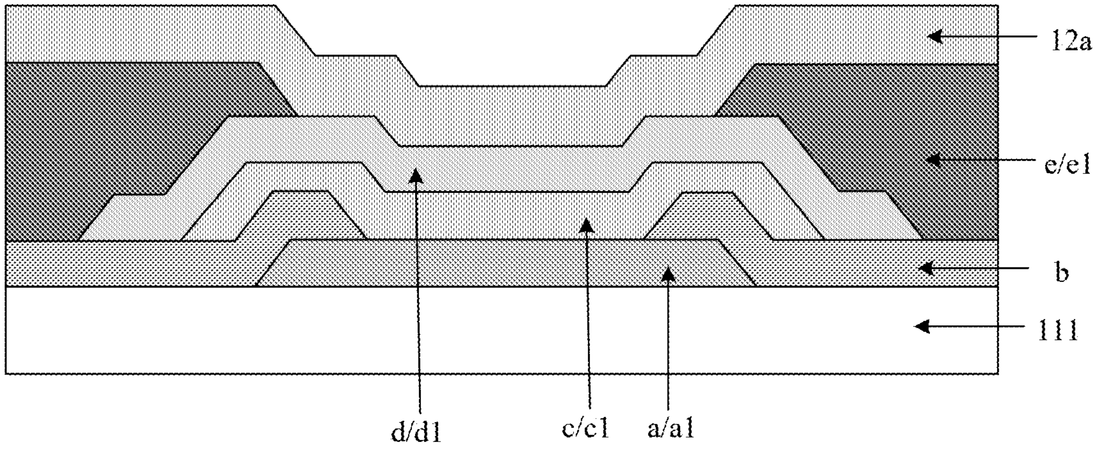
FIG. 14 is a schematic diagram of a signal reception portion of a connection interface before an initial protection layer is etched according to some embodiments of the present disclosure.
Figure 15:
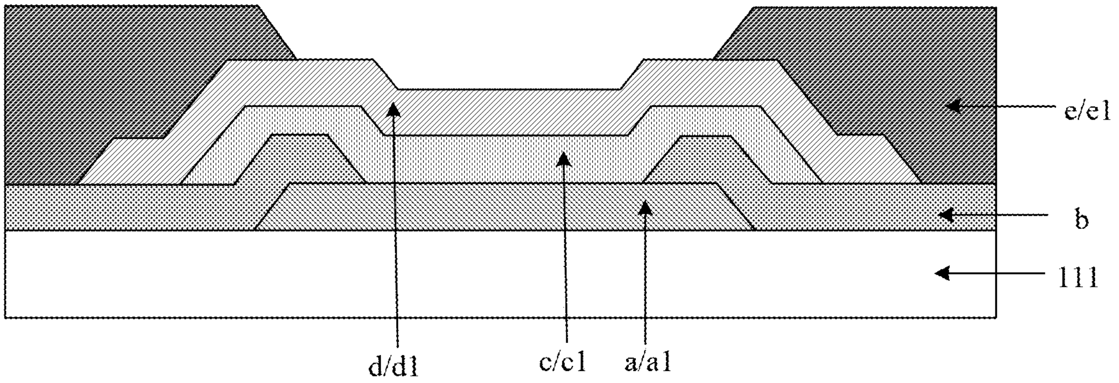
FIG. 15 is a schematic diagram of a signal reception portion of a connection interface according to some embodiments of the present disclosure.

In the embodiments of the present disclosure, referring to FIG. 14, the signal reception portion G1 of the connection interface G is covered by the initial protection layer 12*a* after the preparation of the color filter layer 15 is completed. Accordingly, referring to FIG. 13, FIG. 15, and FIG. 16, the initial protection layer is etched, such that the signal reception portion G1 of the connection interface G is exposed from the target protection layer 12 obtained by etching, which in turn facilitates the connection with the driver circuit in the touch panel to receive the driving signal provided by the driver circuit. As FIG. 15 shows the signal reception portion G1 of the connection interface G, the reason why the target protection layer 12 is not shown in FIG. 15 is that the signal reception portion G1 is exposed by the target protection layer 12.

Figure 16:
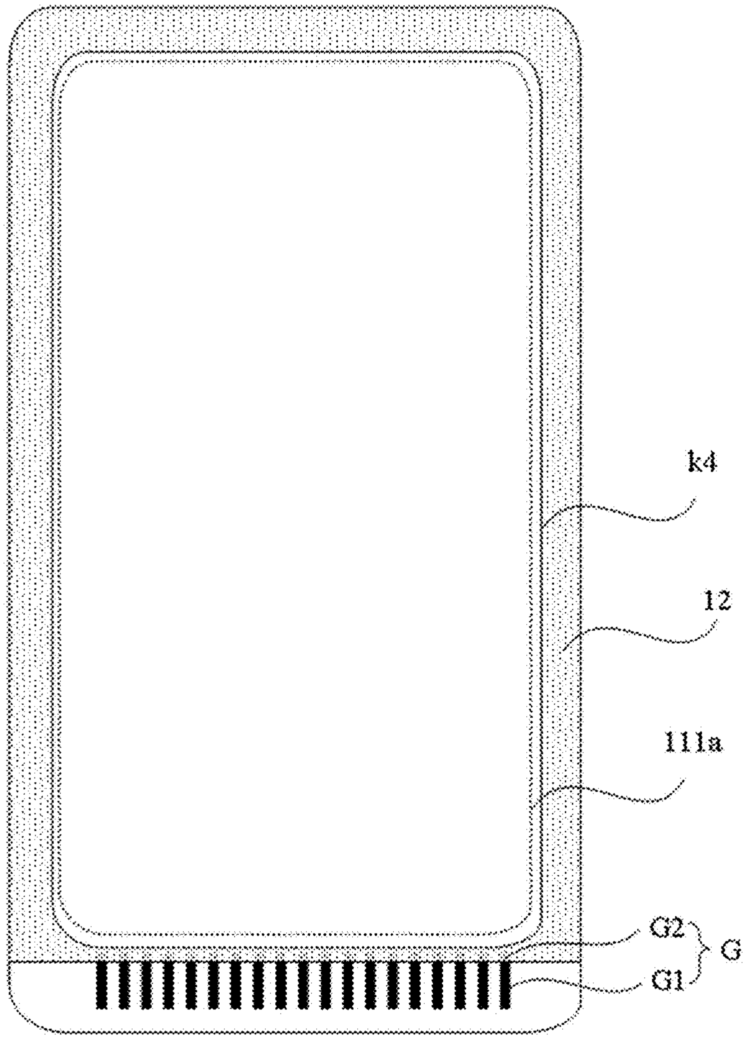
FIG. 16 is a schematic diagram of a target protection layer and a connection interface according to some embodiments of the present disclosure.

In addition, referring to FIG. 16, the target protection layer 12 also has a fourth opening k4. An orthographic projection of the fourth opening k4 on the base substrate covers the display region 111*a* to expose the display region 111*a*. It should be noted that the target protection layer 12 shown in FIG. 16 may also be disposed in other regions of the peripheral area 111*b* than the bonding area 111*b*1. For example, the target protection layer 12 is also disposed in the peripheral region 111*b* on the upper side, the left side, and the right side of the display region 111*a*. In addition, the target protection layer 12 may also not be disposed in these regions, which is not limited in the embodiments of the present disclosure.

In some embodiments, the driver circuit may be integrated on a flexible circuit board, and the flexible circuit board may be bound and connected to the signal reception section G1 of the connection interface G, which in turn transmits a driving signal to the signal reception section G1.

In the embodiments of the present disclosure, the first opening k1 in the initial protection layer formed in the above step S102 may be designed to be as large as possible, which in turn improves the contact area between the first touch connection pattern in the touch module 13 and the conductive pattern in the connection interface G, and reduces the lap resistance. Exemplarily, referring to FIG. 17, a boundary k1*a* of the first opening k1 away from the display region 111*a* and a boundary L5 of the target protection layer 12 away from the display region 111*a* are collinear.

In addition, the second opening k2 of the touch insulating layer 13*c* in the touch module 13 is designed to be as large as possible, which in turn increases the contact area between the second touch connection pattern and the first touch connection pattern and reduces the lap resistance. Exemplarily, referring to FIG. 17, a boundary k2*a* of the second opening k2 away from the display region 111*a* and a boundary L4 of the touch insulating layer 13*c* away from the display region 111*a* are collinear.

Figure 17:
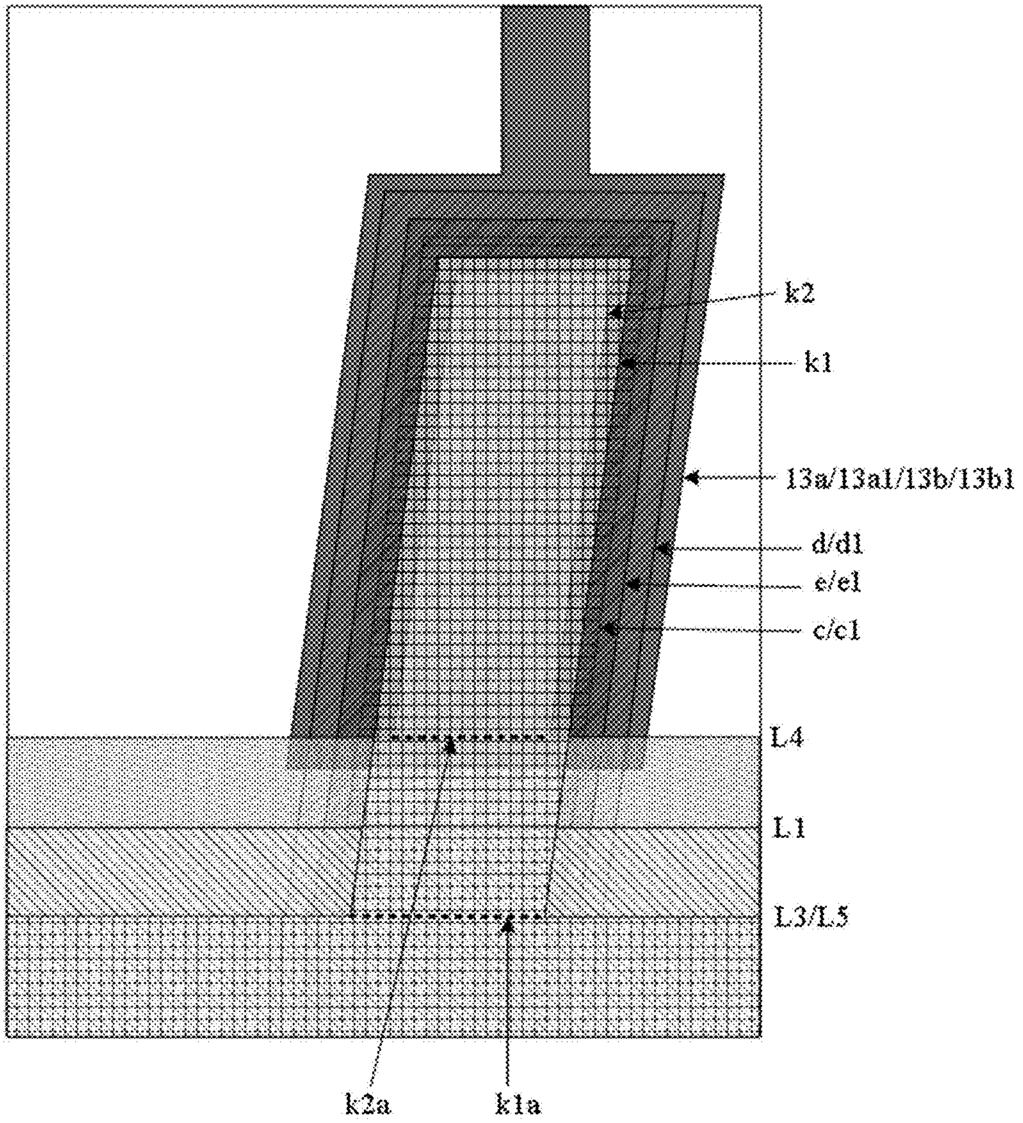
FIG. 17 is a partial schematic diagram of a connection interface according to some embodiments of the present disclosure.

In order to clearly illustrate the relationship of the various structures, the second insulating layer 16 is not shown in FIG. 17 (the actual product has the second insulating layer 16), or the touch panel shown in FIG. 17 does not itself include the second insulating layer 16 (the actual product does not have the second insulating layer 16).

Referring to FIG. 13 and FIG. 17, a boundary L4 of the touch insulating layer 13*c* away from the display region 111*a*, a boundary L1 of the first insulating layer 14 away from the display region 111*a*, and a boundary L3 of the third insulating layer 155 away from the display region 111*a* are arranged in a direction away from the display region 111*a*. In addition, the boundary L5 of the target protection layer 12 away from the display region 111*a* and the boundary L3 of the third insulating layer 155 away from the display region 111*a* are collinear.

It should be noted that, referring to FIG. 15, in the touch panel prepared from the above steps S101 to S107, the film layer constituting the signal reception portion G1 of the connection the interface G includes a plurality of conductive patterns in the conductive pattern group.

Figure 18:
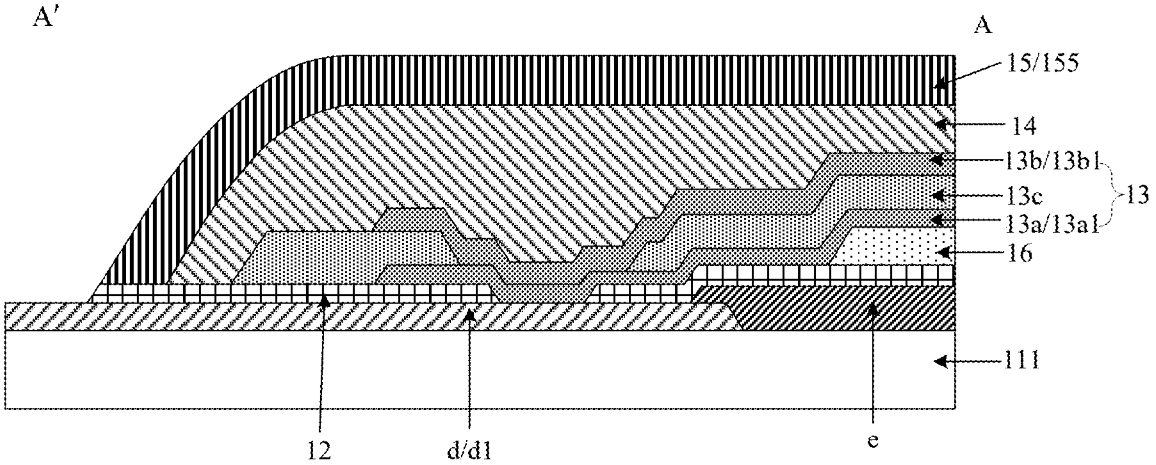
FIG. 18 is a cross-sectional view of FIG. 13 along the direction AA'.
Figure 19:
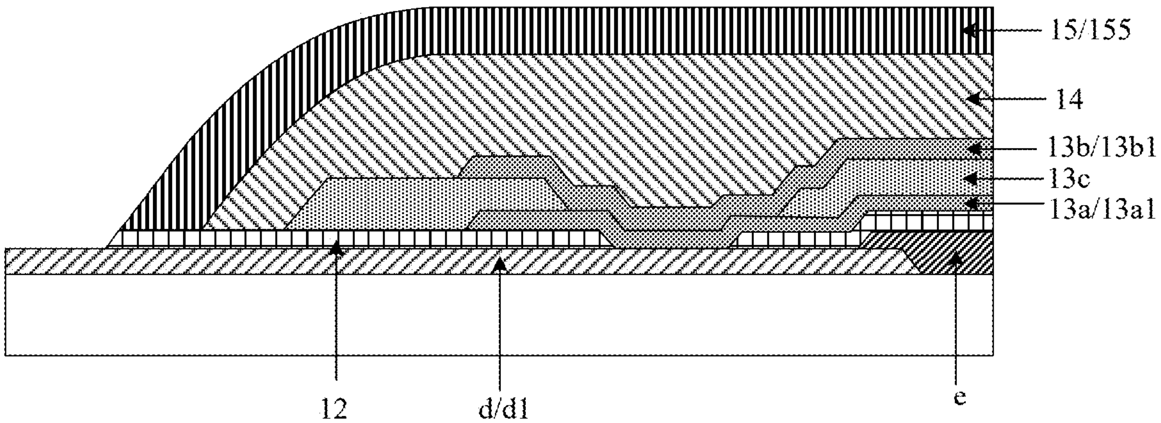
FIG. 19 is a schematic diagram of a signal transmission portion of a connection interface according to some embodiments of the present disclosure.

Also, referring to FIG. 18 and FIG. 19, the film layer constituting the signal transmission portion G2 of the connection interface G includes a plurality of conductive patterns in the conductive pattern group, the first touch connection pattern 13*a*1, and the second touch connection pattern 13*b*1.

In some embodiments, combined with FIG. 15, FIG. 18, and FIG. 19, the display module 11 includes a gate layer a, an interlayer dielectric layer b, a first source-drain layer c, a first planarization layer (not shown in the figures), a second source-drain layer d, and a second planarization layer e disposed on a side of the base substrate 111 and stacked in sequence. The plurality of conductive patterns in the conductive pattern group constituting the connection interfaces G include a gate pattern a1 disposed in the gate layer a, a first source-drain pattern c1 disposed in the first source-drain layer c, and a second source-drain pattern d1 disposed in the second source-drain layer d. The first planarization layer has a first via, and the first source-drain pattern c1 and the gate pattern a1 are connected through the first via. The second planarization layer e has a second via e1, and the second via e1 is used for connecting a pattern in the subsequent first touch layer 13*a* and the second source-drain pattern d1.

In some embodiments, the orthographic projection of the first opening k1 on the base substrate 111, and the orthographic projection of the second opening k2 on the base substrate 111, are disposed within an orthographic projection of the second via e1 on the base substrate 111.

A boundary of the second via e1 close to the display region 111*a* is disposed on a side of a boundary of the touch insulating layer 13*c* close to the display region 111*a*. A boundary of the second via e1 away from the display region 111*a* is disposed on a side of a boundary of the target protection layer 12 away from the display region 111*a*. That is, the second source-drain pattern d1 may be exposed from the second via e1, which in turn enables the connection interface G to realize the reception of a signal or the transmission of a signal.

The sequence of the steps of the method for preparing the touch panel provided by the embodiments of the present disclosure may be appropriately adjusted, and the steps may be increased or decreased accordingly. For example, step S103 may be Canceled according to the actual situation. That is, as in FIG. 19, the touch module 13 can be formed directly on a side of the initial protection layer away from the display module 11. This method can reduce the number of masks used in the preparation of the touch panel 1, which in turn can save the preparation cost. Any person skilled in the art who is familiar with the technical field can easily think of variations of the method within the technical scope disclosed in the present disclosure shall be covered by the scope of protection of the present disclosure, and therefore will not repeat the details.

In summary, the embodiments of the present disclosure provide a method for preparing a touch panel. According to the method, after the display module is prepared, an initial protection layer covering a connection interface in the display module is formed, and the initial protection layer is used for protecting the connection interface. As a result, in the subsequent process of forming the touch film layer, the first insulating layer, and the color filter layer, even if a developer is required for the developing process, the pattern in the connection interface cannot be affected, and the yield of the connection interface can be ensured. After the preparation of the color filter layer is completed, the initial protection layer is etched, such that the signal reception portion of the connection interface is exposed from the finally obtained target protection layer, thereby enabling the signal reception portion to receive the drive signal provided by the drive circuit, and realizing the reception of the signal.

Figure 20:
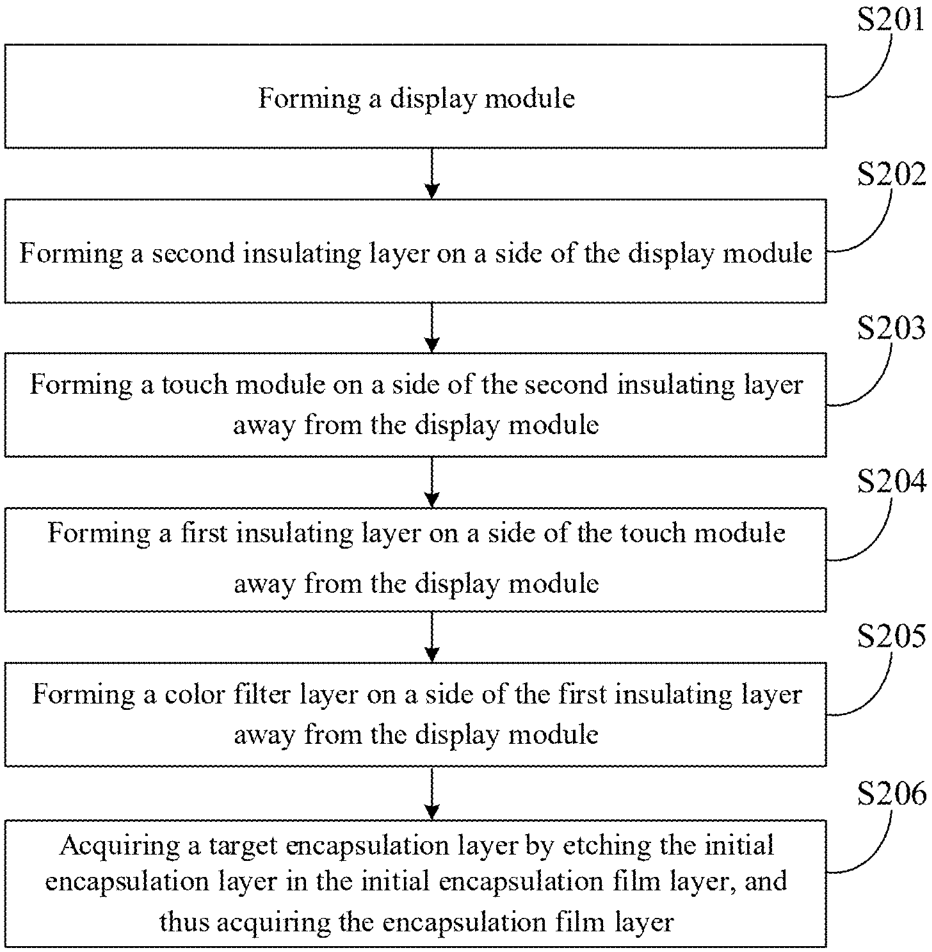
FIG. 20 is a flow chart of a method for preparing another touch panel according to some embodiments of the present disclosure.

FIG. 20 is a flowchart of another method for preparing a touch panel provided by the embodiments of the present disclosure. Referring to FIG. 20, the method includes the following steps.

In step S201, a display module is formed.

In the embodiments of the present disclosure, the display module 11 may be a flexible display module 11 to enable folding of the display module 11. In some embodiments, the display module 11 may be an organic light-emitting diode (OLED) display module 11.

Figure 21:
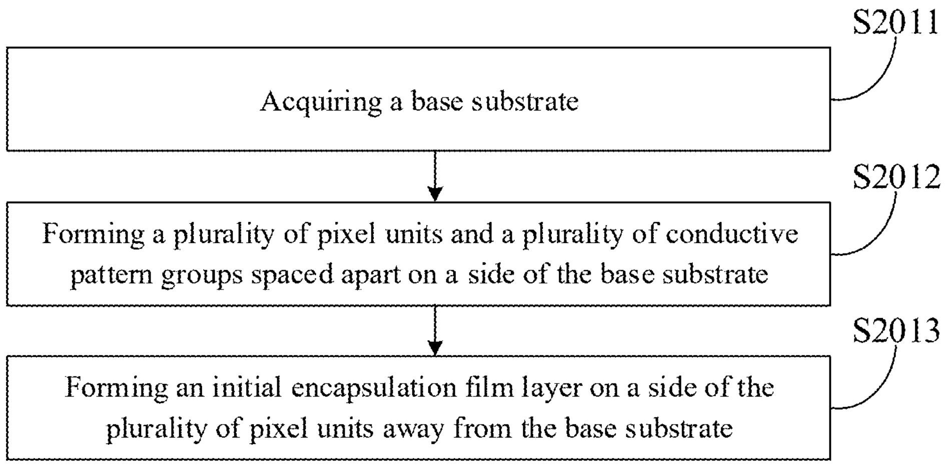
FIG. 21 is a flowchart of a method for preparing a display module according to some embodiments of the present disclosure.

Referring to FIG. 21, the process of forming the display module 11 includes the following steps.

In step S2011, a base substrate is acquired.

In the embodiment of the present disclosure, for the specific implementation of step S2011, reference may be made to the detailed description of step S1011 described above, and details are not described herein again in the embodiments of the present disclosure.

In step S2012, a plurality of pixel units and a plurality of conductive pattern groups spaced apart are formed on a side of the base substrate.

In the embodiment of the present disclosure, for the specific implementation of step S2012, reference may be made to the detailed description of step S1012 described above, and details are not described herein again in the embodiments of the present disclosure.

In step S2103, an initial encapsulation film layer is formed on a side of the plurality of pixel units away from the base substrate.

In the embodiments of the present disclosure, the initial encapsulation film layer may be used to encapsulate the plurality of pixel units. The initial encapsulation film layer includes at least an initial encapsulation layer. An orthographic projection of the initial encapsulation layer on the base substrate 111 covers the display region 111*a* and the orthographic projection of the connection interface G on the base substrate 111.

As a result, the initial encapsulation layer not only enables encapsulation of the display region 111*a*, but also protects the connection interface G from the influence of the developing process on the connection interface G during subsequent formation of the various structures in the color filter layer 15.

Typically, an encapsulation film layer included in the display module 11 includes a first encapsulation layer, a second encapsulation layer, and a third encapsulation layer that are stacked in a direction away from the base substrate 111.

In some embodiments, the first encapsulation layer and the third encapsulation layer may be made of an inorganic material and the second encapsulation layer may be made of an organic material. For example, the first encapsulation layer and the third encapsulation layer may be made of one or more inorganic oxides such as silicon nitride (SiNx), silicon oxide (SiOx), and silicon nitride oxide (SiOxNy). The second encapsulation layer may be made of a resin material. The resin may be a thermoplastic resin or a thermosetting resin, the thermoplastic resin may include an acrylic (PMMA) resin, and the thermosetting resin may include an epoxy resin.

In the embodiments of the present disclosure, the second encapsulation layer may be prepared by using ink jet printing (IJP). The first encapsulation layer and the third encapsulation layer may be prepared by using a chemical vapor deposition (CVD).

In step S2013, the initial encapsulation layer in the initial encapsulation film layer may be a first encapsulation layer or a second encapsulation layer. A boundary of the initial encapsulation layer away from the display region 111*a* is further away from the display region 111*a* relative to a boundary of the other encapsulation layer in the initial encapsulation film layer away from the display region 111*a*. Exemplarily, assuming the first encapsulation layer is the initial encapsulation layer, a boundary of the first encapsulation layer away from the display region 111*a* is further away from the display region 111*a* relative to a boundary of the second encapsulation layer away from the display region 111*a*.

In addition, in the plurality of connection interfaces G included in the display module 11, some of the connection interfaces G may be touch interfaces. The touch interface may be used to transmit a signal for a touch electrode in the touch panel.

For the touch interface, the touch interface includes, in addition to a signal reception portion G1, a signal transmission portion G2. The signal transmission portion G2 is close to the display region 111*a* relative to the signal reception portion G1. The signal received by the signal reception portion G1 can thus be transmitted to the touch electrode through the signal transmission portion G2. The touch electrode may be disposed in a first touch layer 13*a*, and/or a second touch layer 13*b* in a touch module 13.

In this implementation, referring to FIG. 22, the initial encapsulation layer also has a plurality of third openings k3, and an orthographic projection of each of the third openings k3 on the base substrate 111 at least partially overlaps an orthographic projection of the signal transmission portion G2 on the base substrate 111 to expose at least a partial region of one signal transmission portion G2, such that the touch electrode in the subsequently formed touch module 13 is connected to the signal transmission portion G2 through the third opening K3. For the design of the initial encapsulation layer in the bonding region, reference may be made to the design of the initial protection layer in the bonding region in the above embodiments.

In the case that the initial encapsulation layer to be formed has a plurality of third openings k3, taking the photoresist as a positive photoresist as an example, the mask is designed with a plurality of third mask openings. An orthographic projection of the third mask opening on the base substrate 111 at least partially overlaps the orthographic projection of the signal transmission portion G2 on the base substrate 111.

In step S202, a second insulating layer is formed on a side of the display module.

In the embodiments of the present disclosure, for the specific implementation of step S202, reference may be made to the detailed description of step S102 described above, and details are not described herein again in the embodiments of the present disclosure.

In step S203, a touch module is formed on a side of the second insulating layer away from the display module.

In the embodiments of the present disclosure, for the specific implementation of step S203, reference may be made to the detailed description of step S103 described above, and details are not described herein again in the embodiments of the present disclosure.

The difference between step S203 and the above step S103 is that in step S203, the first touch connection pattern 13*a*1 in the touch module 13 and the signal transmission portion G2 are connected through the third opening k3.

In step S204, a first insulating layer is formed on a side of the touch module away from the display module.

In the embodiments of the present disclosure, for the specific implementation of step S204, reference may be made to the detailed description of step S104 described above, and details are not described herein again in the embodiments of the present disclosure.

In step S205, a color filter layer is formed on a side of the first insulating layer away from the display module.

In the embodiments of the present disclosure, for the specific implementation of step S205, reference may be made to the detailed description of step S105 described above, and details are not described herein again in the embodiments of the present disclosure.

In step S206, a target encapsulation layer is acquired by etching the initial encapsulation layer in the initial encapsulation film layer, and thus the encapsulation film layer is acquired.

Figure 22:
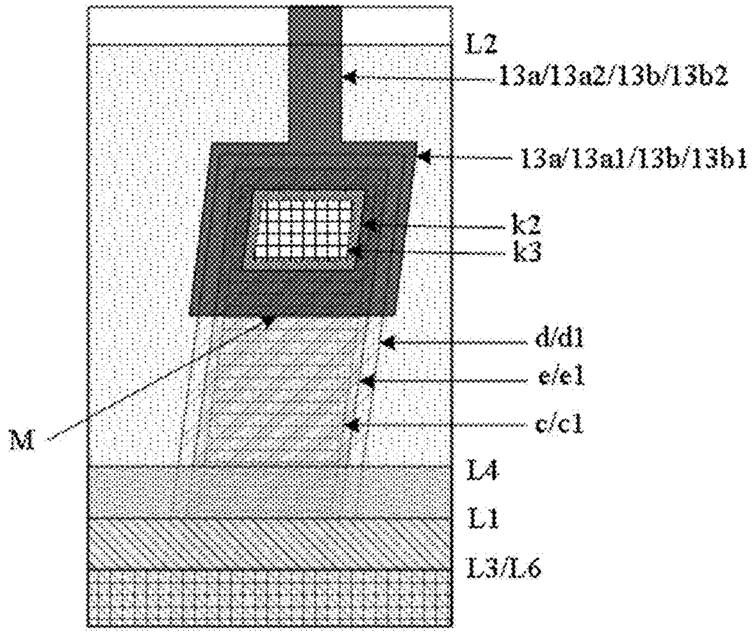
FIG. 22 is another schematic diagram of forming a touch module according to some embodiments of the present disclosure.

In the embodiments of the present disclosure, referring to FIG. 22, after completing the preparation of the color filter layer 15, the initial encapsulation layer in the initial encapsulation film layer may be etched to cause the target encapsulation layer obtained by etching to expose the signal reception portion G1 of the connection interface G, which in turn facilitates the connection with the driver circuit in the touch panel 1 to receive the driving signal provided by the driver circuit.

In some embodiments, the driver circuit may be integrated on a flexible circuit board, and the flexible circuit board may be bound and connected to the signal reception section G1 of the connection interface G, which in turn transmits a driving signal to the signal reception section G1.

In the embodiments of the present disclosure, the third opening k3 in the initial encapsulation layer formed in the above step S2013 may be designed to be as large as possible, which in turn improves the contact area of the first touch connection pattern 13*a*1 in the touch module 13 and the conductive pattern in the connection interface G, and reduces the lap resistance. Exemplarily, referring to FIG. 23, a boundary of the third opening k3 away from the display region 111*a* and a boundary L6 of the target encapsulation layer away from the display region 111*a* are collinear.

In addition, the second opening k2 of the touch insulating layer 13*c* in the touch module 13 is designed to be as large as possible, which in turn improves the contact area of the second touch connection pattern 13*b*1 and the first touch connection pattern 13*a*1, and reduces the lap resistance. Exemplarily, referring to FIG. 23, a boundary of the second opening k2 away from the display region 111*a* and a boundary L4 of the touch insulating layer 13*c* away from the display region 111*a* are collinear.

Figure 23:
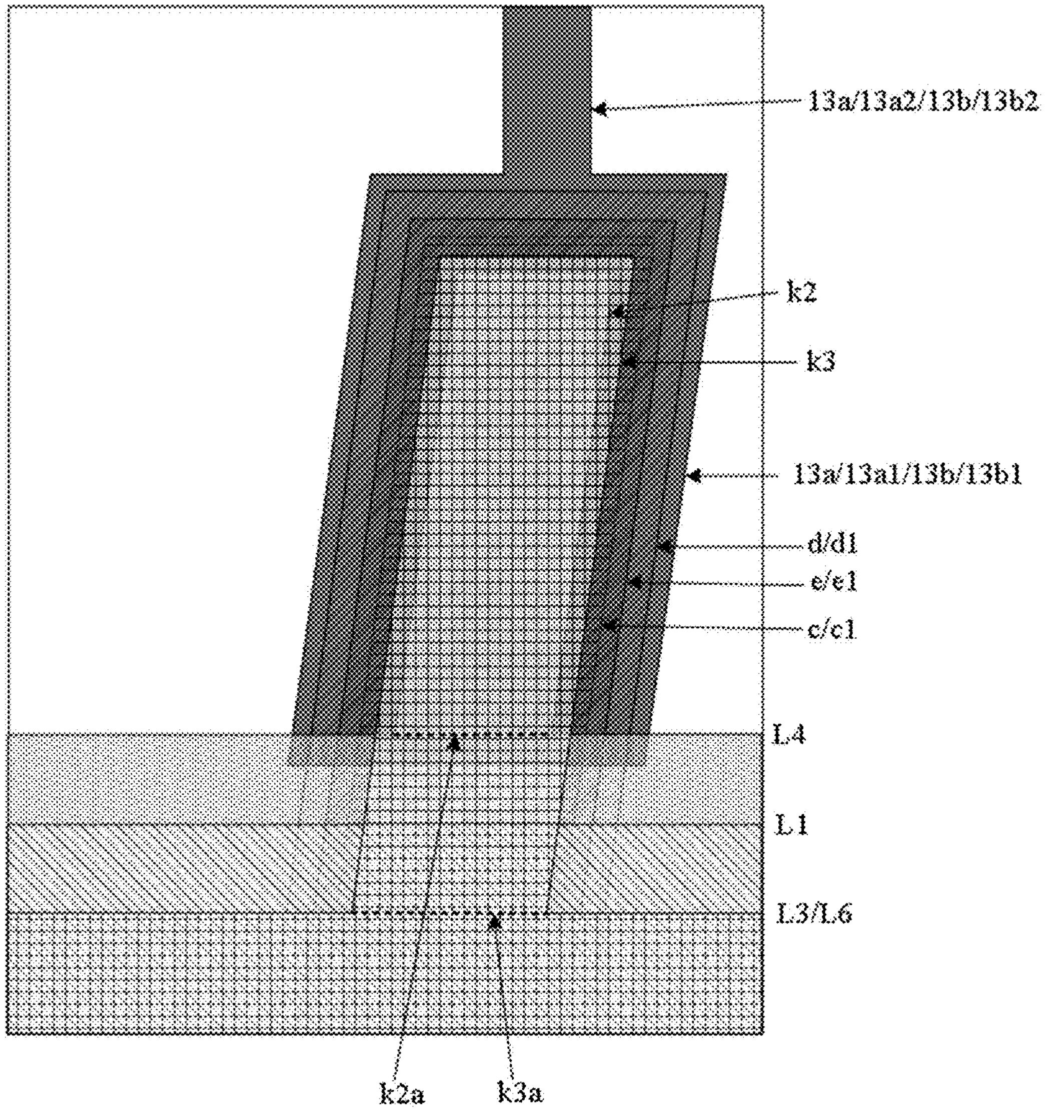
FIG. 23 is a schematic diagram of another connection interface according to some embodiments of the present disclosure.

Referring to FIG. 23, a boundary L4 of the touch insulating layer 13*c* away from the display region 111*a*, a boundary L1 of the first insulating layer 14 away from the display region 111*a*, and a boundary L3 of the third insulating layer 155 away from the display region 111*a* are arranged in a direction away from the display region 111*a*. In addition, the boundary L6 of the target encapsulation layer away from the display region 111*a* and the boundary L3 of the third insulating layer 155 away from the display region 111*a* are collinear.

It should be noted that in the touch panel prepared from the above steps S201 to S206, the film layer constituting the signal reception portion G1 of the connection interface G includes a plurality of conductive patterns in the conductive pattern group (e.g., FIG. 14).

In addition, referring to FIG. 16 and FIG. 19, the film layer constituting the signal transmission portion G2 of the connection interface G includes a plurality of conductive patterns in the conductive pattern group, a first touch connection pattern 13*a*1, and a second touch connection pattern 13*b*1.

In some embodiments, combined with FIG. 15, FIG. 18, and FIG. 19, the display module 11 includes a gate layer a, an interlayer dielectric layer b, a first source-drain layer c, a first planarization layer d, a second source-drain layer d, and a second planarization layer e disposed on a side of the base substrate 111 and stacked in sequence. The plurality of conductive patterns in the conductive pattern group constituting the connection interface G includes a gate pattern a1 disposed in the gate layer a, a first source-drain pattern c1 disposed in the first source-drain layer c, and a second source-drain pattern d1 disposed in the second source-drain layer d.

The sequence of the steps of the method for preparing the touch panel provided by the embodiments of the present disclosure may be appropriately adjusted, and the steps may be increased or decreased accordingly. For example, step S202 may be Canceled according to the actual situation. That is, referring to FIG. 19, the touch module 13 can be formed directly on a side of the display module 11. This method can reduce the number of masks used in the preparation of the touch panel 1, which in turn can save the preparation cost. Any person skilled in the art who is familiar with the technical field can easily think of variations of the method within the technical scope disclosed in the present disclosure shall be covered by the scope of protection of the present disclosure, and therefore will not repeat the details.

In the embodiments of the present disclosure, step S2013 designs the inorganic layer (the first encapsulation layer or the third encapsulation layer) in the encapsulation film layer included in the display module, so as to cover the connection interface to avoid the influence on the connection interface during subsequent preparation of the color filter layer. Afterward, the inorganic layer in the signal reception portion of the connection interface is removed in step S206 to realize signal reception. This method does not require the design of an additional protection layer, but rather adjusts the preparation process of the inorganic layer in the encapsulation film layer that is inherent in the display module, so as to protect the connection interface. As a result, the preparation process can be simplified and costs can be saved.

In summary, the embodiments of the present disclosure provide a method for preparing a touch panel, which can ensure that an initial encapsulation layer in an initial encapsulation film layer of an initial display module plays a role in protecting a connection interface when the initial display module is prepared. Therefore, in the subsequent formation of the touch module, the first insulating layer, and the color filter layer, even if a developer needs to be used for the developing process, the pattern in the connection interface cannot be affected, and the yield of the connection interface can be ensured. After the preparation of the color filter layer is completed, the initial encapsulation layer is etched, such that the signal reception portion of the connection interface is exposed from the target encapsulation layer in the encapsulation film layer included in the finally obtained display module, thereby enabling the signal reception portion to receive the drive signal provided by the drive circuit, and realizing the reception of the signal.

Figure 24:
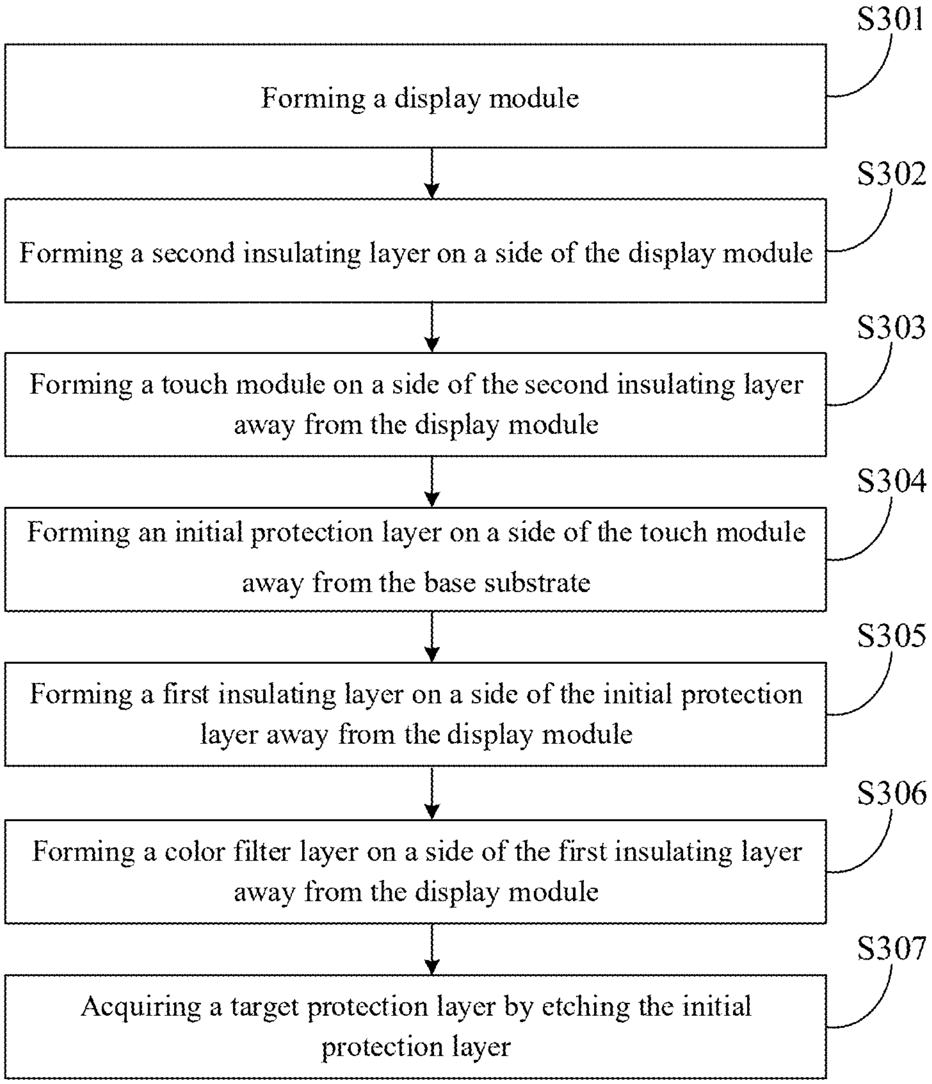
FIG. 24 is a flowchart of a method for preparing yet another touch panel according to some embodiments of the present disclosure.

FIG. 24 is a flowchart of yet another method for preparing a touch panel according to some embodiments of the present disclosure, referring to FIG. 24, the method includes the following steps.

In step S301, a display module is formed.

In the embodiments of the present disclosure, the display module 11 may be a flexible display module 11 to enable folding of the display module 11. In some embodiments, the display module 11 may be an organic light-emitting diode (OLED) display module 11.

The process of forming the display module 11 may be the same as steps S1011 to S1013 as described above, and such as including the following steps.

In step S3011, a base substrate is acquired.

In the embodiments of the present disclosure, for the specific implementation of step S3011, reference may be made to the detailed description of step S1011 described above, and details are not described herein again in the embodiments of the present disclosure.

In step S3012, a plurality of pixel units and a plurality of conductive pattern groups spaced apart are formed on a side of the base substrate.

In the embodiments of the present disclosure, for the specific implementation of step S3012, reference may be made to the detailed description of step S1012 described above, and details are not described herein again in the embodiments of the present disclosure.

In step S3103, an encapsulation film layer is formed on a side of the plurality of pixel units away from the base substrate.

In the embodiments of the present disclosure, for the specific implementation of step S3013, reference may be made to the detailed description of step S1013 described above, and details are not described herein again in the embodiments of the present disclosure.

In step S302, a second insulating layer is formed on a side of the display module.

In the embodiments of the present disclosure, for the specific implementation of step S302, reference may be made to the detailed description of step S102 described above, and details are not described herein again in the embodiments of the present disclosure.

In step S303, a touch module is formed on a side of the second insulating layer away from the display module.

In the embodiments of the present disclosure, the touch module 13 includes a first touch layer 13*a*, a touch insulating layer 13*c*, and a second touch layer 13*b* stacked in sequence. Therefore, the process of forming the touch module 13 includes: forming the first touch layer 13*a* on a side of the second insulating layer 16 away from the display module 11; forming the touch insulating layer 13*c* on a side of the first touch layer 13*a* away from the base substrate 111; and forming the second touch layer 13*b* on a side of the touch insulating layer 13*c* away from on the base substrate 111.

It is noted that the touch module 13 includes a first touch electrode 131 and a second touch electrode 132 disposed in the display region 111*a* and insulated from each other. One of the first touch electrode 131 and the second touch electrode 132 is a Transmit (Tx) electrode and the other touch electrode is a Receive (Rx) electrode.

In some embodiments, the first touch electrode 131 includes a bridging electrode 1311 disposed in the first touch layer 13*a*, and a main electrode 1312 disposed in the second touch layer 13*b*, the bridging electrode 1311 and the main electrode 1312 being connected through a via in the touch insulating layer 13*c*. The second touch electrode 132 is disposed in the second touch layer 13*b*.

Figure 25:
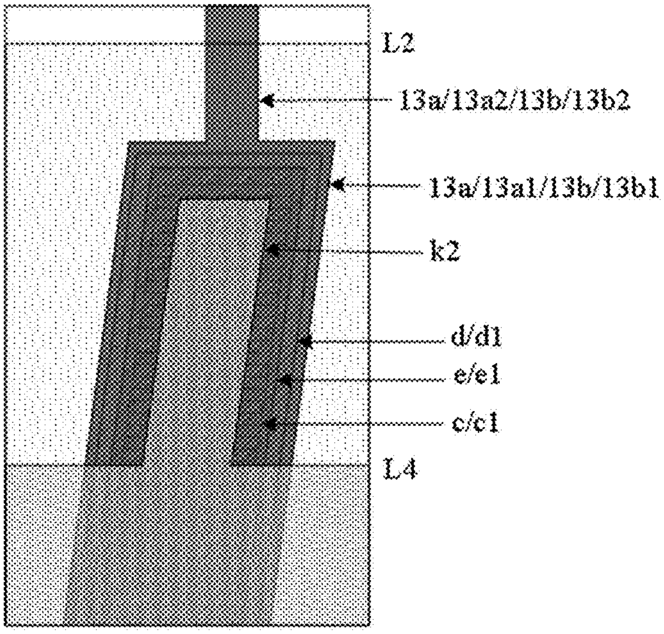
FIG. 25 is yet another schematic diagram of forming a touch module according to some embodiments of the present disclosure.

Referring to FIG. 25, the first touch layer 13*a* includes a plurality of first touch connection patterns 13*a*1 disposed in the bonding region 111*b*1 and a plurality of first touch connection lines 13*a*2 corresponding to the plurality of first touch connection patterns 13*a*1. Each first touch connection pattern 13*a*1 is directly connected to a conductive pattern furthest away from the base substrate 111 in the connection interface G. One end of each first touch connection line 13*a*2 is connected to a corresponding first touch connection pattern 13*a*1, and the other end of each first touch connection line 13*a*2 is connected to the first touch electrode 131 or the second touch electrode 132.

The touch insulating layer 13*c* has a plurality of second openings k2, an orthographic projection of each of the second openings k2 on the base substrate 111 partially overlaps an orthographic projection of a first touch connection pattern 13*a*1 on the base substrate 111, and the second openings k2 is used to expose at least a partial region of one first touch connection pattern 13*a*1.

The second touch layer 13*b* includes a plurality of second touch connection patterns 13*b*1 disposed in the bonding region 111*b*1 and a plurality of second touch connection lines 13*b*2 corresponding to the plurality of second touch connection patterns 13*b*1. Each of the second touch connection patterns 13*b*1 is connected to one first touch connection pattern 13*a*1 through the second opening k2. One end of each second touch connection line 13*b*2 is connected to a corresponding second touch connection pattern 13*b*1, and the other end of each second touch connection line 13*b*2 is connected to the first touch electrode 131 or the second touch electrode 132.

That is, in the embodiments of the present disclosure, after the signal reception portion G1 of the touch interface receives a signal, the signal can be transmitted to the first touch connection pattern 13*a*1 and the second touch connection pattern 13*b*1 through the signal transmission portion G2 of the touch interface, and thus to the first touch connection line 13*a*2 and the second touch connection line 13*b*2. Further, as the first touch connection line 13*a*2 and the second touch connection line 13*b*2 are connected to a touch electrode, the received signal can be transmitted to the touch electrode, thereby realizing the touch function of the touch panel.

In the embodiments of the present disclosure, the formation process of the first touch layer 13*a* included in the touch module 13 includes: forming a first touch film, and patterning the first touch film using a first touch mask to obtain the first touch layer 13*a*. The formation process of the touch insulating layer 13*c* included in the touch module 13 includes: forming a touch insulating film, and patterning the touch insulating film using a touch insulating mask to obtain the touch insulating layer 13*c*. The formation process of the second touch layer 13*b* included in the touch module 13 includes: forming a second touch film, and patterning the second touch film using a second touch mask to obtain the second touch layer 13*b*.

Taking the photoresist used in the patterning process as a positive photoresist as an example: the first touch mask may have an opening for forming a bridging electrode, an opening for forming the first touch connection pattern 13*a*1, and an opening for forming the first touch connection line 13*a*2; the touch insulating mask has an opening for forming a second opening k2, and an opening for forming a via for connecting a bridging electrode and main electrode connection; and the second touch mask plate may have an opening for forming the main electrode, an opening for forming the second touch electrode 132, an opening for forming the second touch connection pattern 13*b*1, and an opening for forming the second touch connection line 13*b*2.

In step S304, an initial protection layer is formed on a side of the touch module away from the base substrate.

In the embodiments of the present disclosure, after forming the display module 11, an initial protection layer may be formed on a side of the display module 11 designed with a plurality of pixel units. An orthographic projection of the initial protection layer on the base substrate 111 covers an orthographic projection of the connection interface G on the base substrate 111. The initial protection layer is disposed in the entire region shown in FIG. 25, the embodiments of the present disclosure are not schematized using the accompanying drawings.

In some embodiments, the initial protection layer has a fourth opening k4, and an orthographic projection of the fourth opening k4 on the base substrate 111 covers the display region 111*a* to expose the display region 111*a*. The process of forming the initial protection layer includes forming an initial protective film, and patterning the initial protective film using a protection layer mask to obtain the initial protection layer. The specific preparation of the initial protection layer can be described in step S102 above, and the embodiments of the present disclosure are not repeated herein.

In the case that the initial protection layer to be formed has a fourth opening, taking the photoresist as a positive photoresist as an example, the mask used in forming the initial protection layer is designed with a mask opening. An orthographic projection of the mask opening on the base substrate 111 covers the display region 111*a*.

In step S305, a first insulating layer is formed on a side of the initial protection layer away from the display module.

Figure 26:
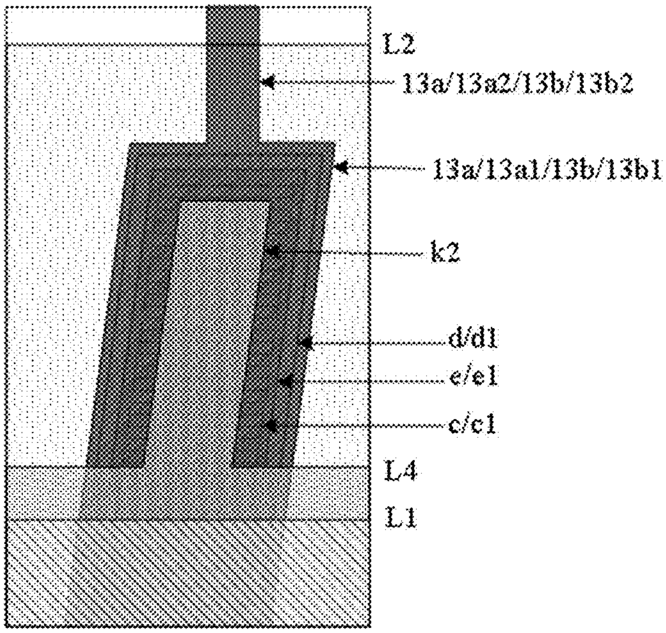
FIG. 26 is another schematic diagram of forming a first insulating layer according to some embodiments of the present disclosure.

In the embodiments of the present disclosure, referring to FIG. 26, for the specific implementation of step S305, reference may be made to the detailed description of step S105 described above, and details are not described herein again in the embodiments of the present disclosure.

In step S306, a color filter layer is formed on a side of the first insulating layer away from the display module.

In the embodiments of the present disclosure, for the specific implementation of step S306, reference may be made to the detailed description of step S106 described above, and details are not described herein again in the embodiments of the present disclosure.

In step S307, a target protection layer is acquired by etching the initial protection layer.

Figure 27:
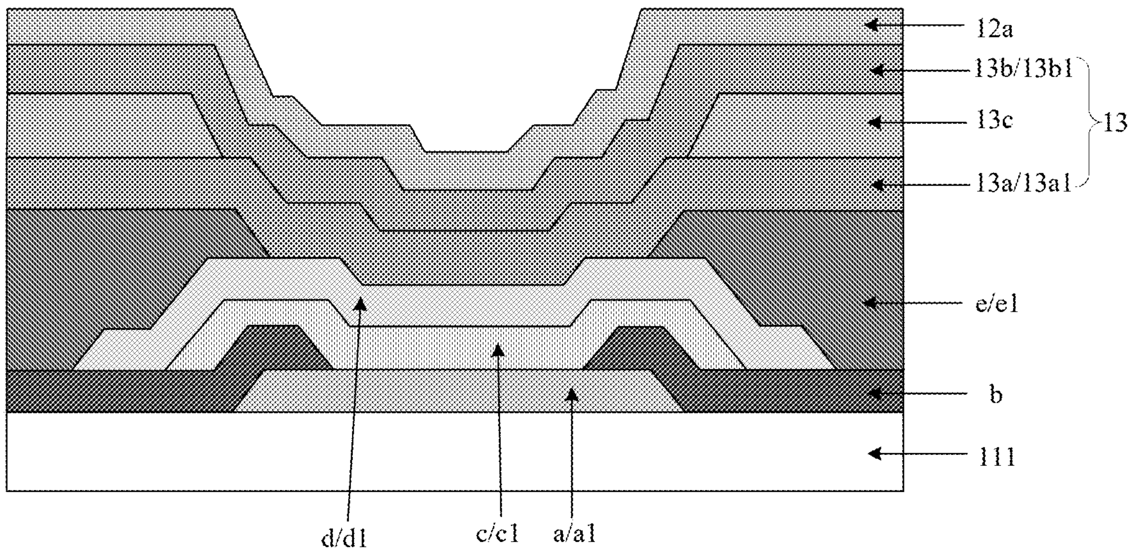
FIG. 27 is a schematic diagram of a signal transmission portion of a connection interface before an initial protection layer is etched according to some embodiments of the present disclosure.

In the embodiments of the present disclosure, referring to FIG. 27, the signal reception portion G1 of the connection interface G is covered by the initial protection layer 12*a* after the preparation of the color filter layer 15 is completed. Accordingly, referring to FIG. 28 and FIG. 29, the initial protection layer 12*a* is etched, such that the signal reception portion G1 of the connection interface G is exposed form the target protection layer 12 obtained by etching, which in turn facilitates connection with the driver circuit in the touch panel to receive the driving signal provided by the driver circuit. In the case that the initial protection layer has a fourth opening k4 covering the display region 111*a*, the target protection layer 12 obtained at step S307 may also have the fourth opening k4.

In some embodiments, the driver circuit may be integrated on a flexible circuit board, and the flexible circuit board may be bound and connected to the signal reception section G1 of the connection interface G, which in turn transmits a driving signal to the signal reception section G1.

Figure 28:
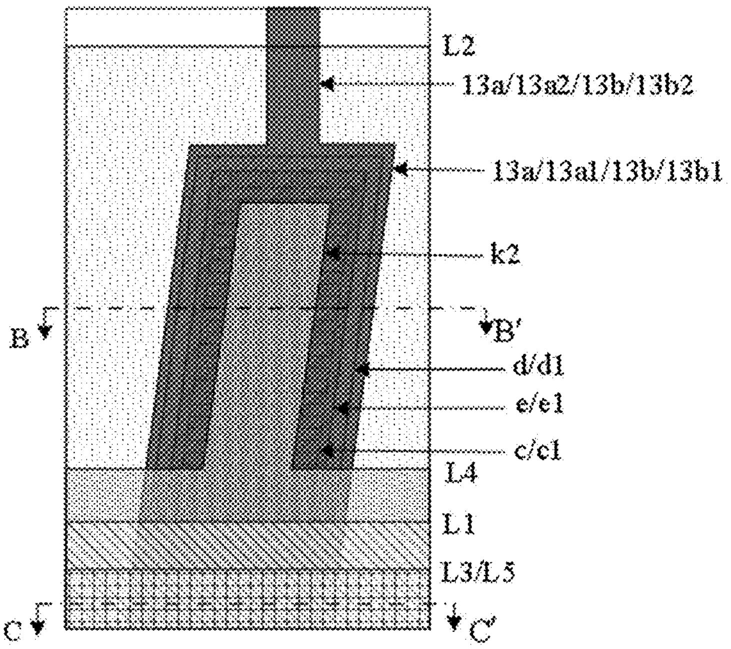
FIG. 28 is another schematic diagram of forming a third insulating layer and a target protection layer according to some embodiments of the present disclosure.
Figure 29:
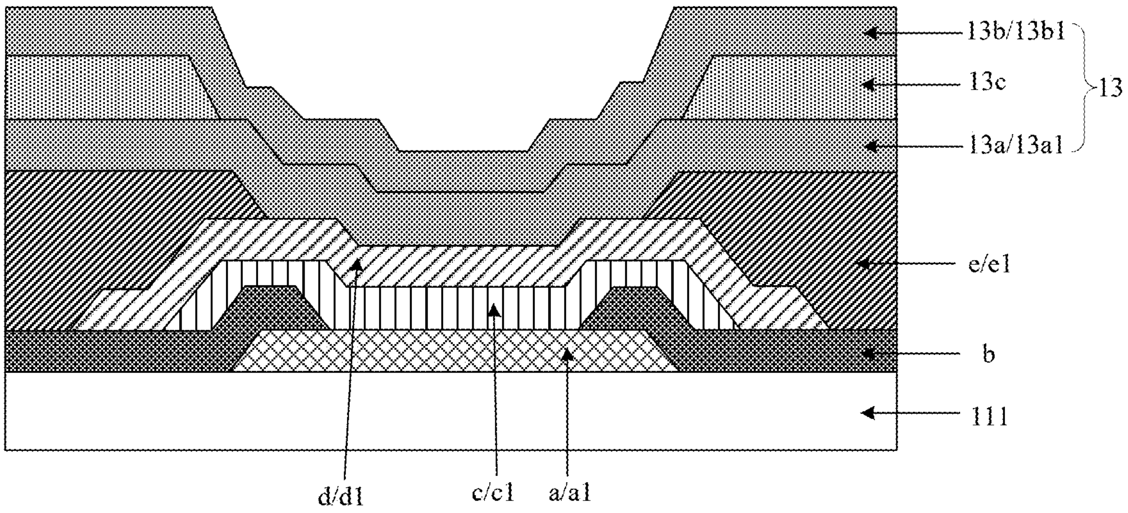
FIG. 29 is a schematic diagram of a signal transmission portion of a connection interface after etching an initial protection layer according to some embodiments of the present disclosure.

Referring to FIG. 28, a boundary L4 of the touch insulating layer 13*c* away from the display region 111*a*, a boundary L1 of the first insulating layer 14 away from the display region 111*a*, and a boundary L3 of the third insulating layer 155 away from the display region 111*a* are arranged in a direction away from the display region 111*a*. In addition, the boundary L5 of the target protection layer 12 away from the display region 111*a* and the boundary L3 of the third insulating layer 155 away from the display region 111*a* are collinear.

Figure 30:
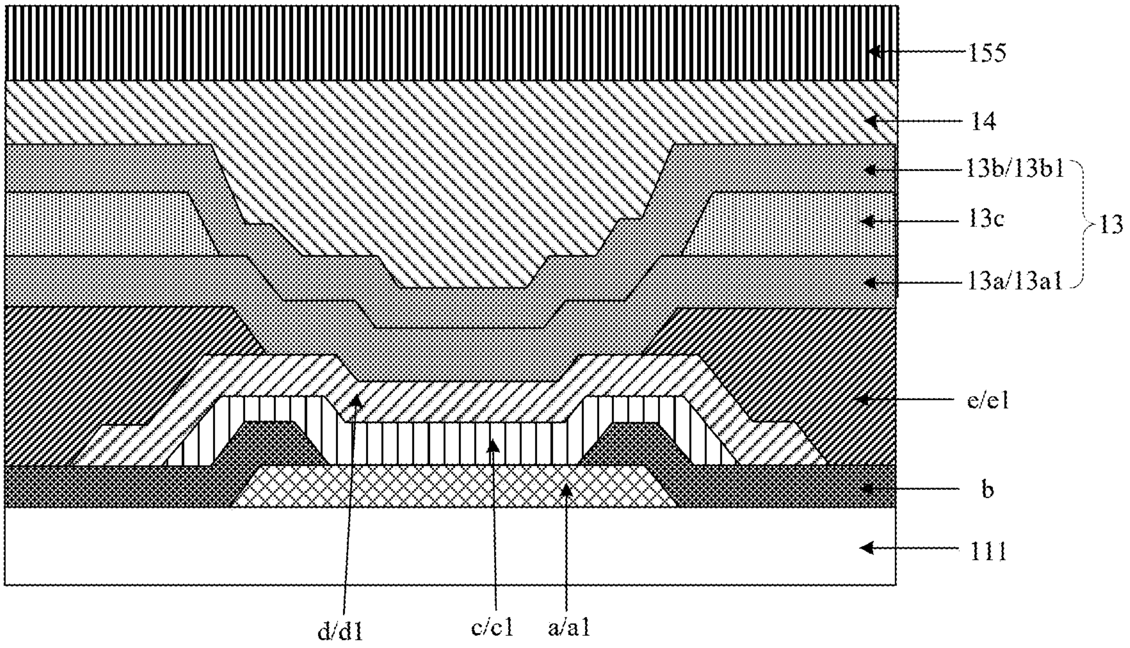
FIG. 30 is a cross-sectional view of FIG. 28 along the BB' direction.
Figure 31:
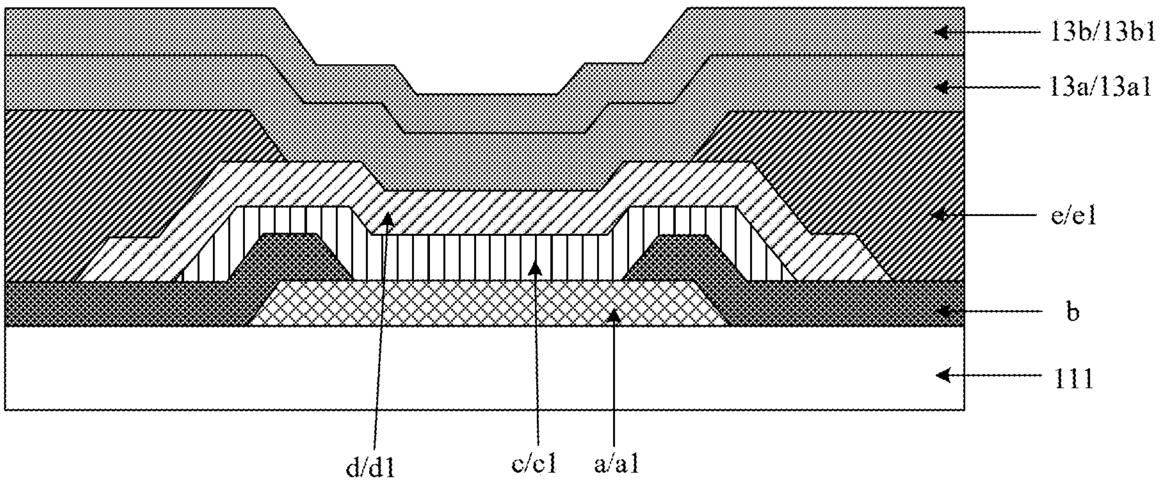
FIG. 31 is a cross-sectional view of FIG. 28 along the CC' direction.

It should be noted that, referring to FIG. 30 and FIG. 31, in the touch panel prepared from the above steps S301 to S306, the film layer constituting the signal reception portion G1 of the connection interface G and the signal transmission portion G2 both include a plurality of conductive patterns (a1, c1, and d1) in the conductive pattern group, the first touch connection pattern 13*a*1, and the second touch connection pattern 13*b*1.

In some embodiments, referring to FIG. 30 and FIG. 31, the display module 11 includes a gate layer a, an interlayer dielectric layer b, a first source-drain layer c, a first planarization layer d, a second source-drain layer d, and a second planarization layer e disposed on a side of the base substrate 111 and stacked in sequence. The plurality of conductive patterns in the conductive pattern group constituting the connection interface G includes a gate pattern a1 disposed in the gate layer a, a first source-drain pattern c1 disposed in the first source-drain layer c, and a second source-drain pattern d1 disposed in the second source-drain layer d.

The sequence of the steps of the method for preparing the touch panel provided by the embodiments of the present disclosure may be appropriately adjusted, and the steps may be increased or decreased accordingly. For example, step S302 may be Canceled according to the actual situation. That is, the touch module 13 can be formed directly on a side of the display module 11. This method can reduce the number of masks used in the preparation of the touch panel 1, which in turn can save the preparation cost. Any person skilled in the art who is familiar with the technical field can easily think of variations of the method within the technical scope disclosed in the present disclosure shall be covered by the scope of protection of the present disclosure, and therefore will not repeat the details.

In summary, the embodiments of the present disclosure provide a method for preparing a touch panel. According to the method, after the display module and the touch module are prepared, an initial protection layer covering a connection interface in the display module is formed, and the initial protection layer is used for protecting the connection interface. Therefore, in the subsequent process of forming the first insulating layer and the color filter layer, even if a developer is used for the developing process, the pattern in the connection interface is not affected, and the yield of the connection interface can be ensured. After the preparation of the color filter layer is completed, the initial protection layer is etched, such that the signal reception portion of the connection interface is exposed from the finally obtained target protection layer, thereby enabling the signal reception portion to receive the drive signal provided by the drive circuit, and realizing the reception of the signal.

Figure 32:
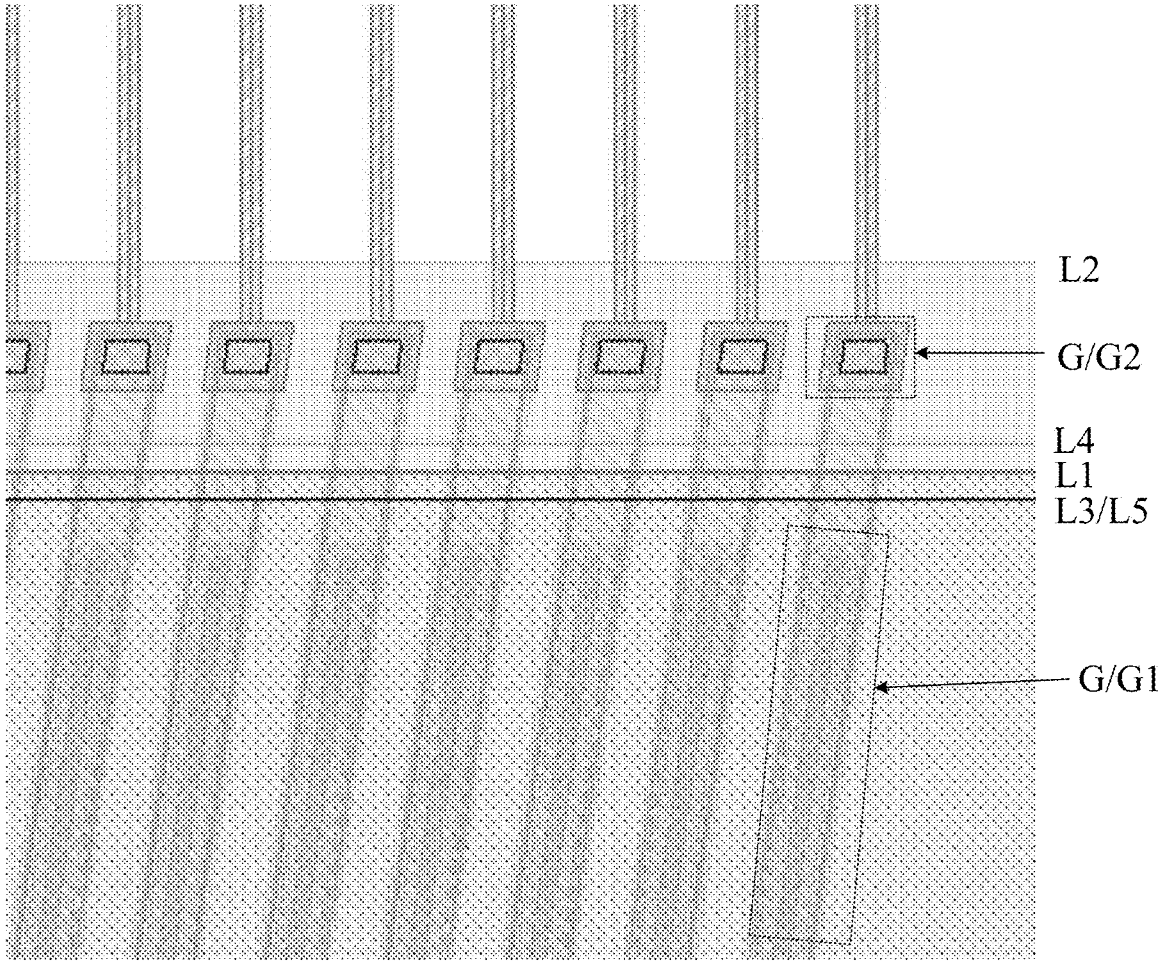
FIG. 32 is a partial schematic diagram of a touch panel according to some embodiments of the present disclosure.

The embodiments of the present disclosure also provide a touch panel, referring to FIG. 15, FIG. 18, and FIG. 32, the touch panel 1 includes a display module 11, a target protection layer 12, a touch module 13, a first insulating layer 14, and a color filter layer 15 (not shown in the figures). In FIG. 18, the target protection layer 12 is disposed between the display module 11 and the touch module 13. Alternatively, the target protection layer 12 is disposed on a side of the touch module 13 away from the display module 11.

In some embodiments, in the case that the target protection layer 12 is disposed between the display module 11 and the touch module 13, the touch panel 1 may be prepared using the first preparation method described above. In the case that the target protection layer 12 is disposed on the side of the touch module 13 away from the display module 11, the touch panel 1 may be prepared using the third preparation method described above.

In addition, the first insulating layer 14 is disposed on a side of the touch module 13 away from the display module 11, and an orthographic projection of the first insulating layer 14 on the base substrate 111 covers the display region 111*a*. The color filter layer 15 is disposed on a side of the first insulating layer 14 away from the display module 11. A third insulating layer 155 included in the color filter layer 15 is shown in FIG. 18.

In the embodiments of the present disclosure, the display module 11 includes a base substrate 111, a plurality of pixel units disposed on a side of the base substrate 111, a plurality of conductive pattern groups disposed on a side of the base substrate 111 and spaced apart, and an encapsulation film layer disposed on a side of the plurality of pixel units away from the base substrate 111.

Referring to FIG. 4, the base substrate 111 has a display region 111*a* and a peripheral region 111*b* surrounding the display region 111*a*. The peripheral region 111*b* includes at least a bonding region 111*b*1. The bonding region 111*b*1 may be a region of the peripheral region 111*b* disposed on the lower side of the display region 111*a*, and the bonding region 111*b*1 may be used to enable the flexible circuit board and the display module 11 to be bound.

The plurality of conductive pattern groups are disposed in the bonding region 111*b*1 of the peripheral region 111*b* of the base substrate 111. Each conductive pattern group includes a plurality of conductive patterns stacked in sequence, and the plurality of conductive patterns included in each conductive pattern group is used to form one connection interface G. That is, the number of connection interfaces G formed may be the same as the number of conductive pattern groups included in the display module 11.

In some embodiments, the plurality of pixel units included in the display module 11 include a plurality of film layers. The plurality of film layers at least include a film layer where the plurality of conductive patterns forming the connection interface G are disposed. As a result, the plurality of conductive patterns can be formed synchronously in the process of forming the plurality of pixel units.

In the embodiments of the present disclosure, the encapsulation film layer can be used to encapsulate the plurality of pixel units, and the boundary of the encapsulation film layer is disposed between the connection interface G and the display region 111*a*. That is, the plurality of connection interfaces G can be exposed from the encapsulation film layer.

In some embodiments, the encapsulation film layer includes a first encapsulation layer, a second encapsulation layer, and a third encapsulation layer that are stacked in a direction away from the base substrate 111.

In some embodiments, the first encapsulation layer and the third encapsulation layer may be made of an inorganic material and the second encapsulation layer may be made of an organic material. For example, the first encapsulation layer and the third encapsulation layer may be made of one or more inorganic oxides such as silicon nitride ($SiN_x$), silicon oxide ($SiO_x$), and silicon nitride oxide ($SiO_xN_y$). The second encapsulation layer may be made of a resin material. The resin may be a thermoplastic resin or a thermosetting resin, the thermoplastic resin may include an acrylic (PMMA) resin, and the thermosetting resin may include an epoxy resin.

In the embodiments of the present disclosure, the second encapsulation layer may be prepared by using ink jet printing (IJP). The first encapsulation layer and the third encapsulation layer may be prepared by using a chemical vapor deposition (CVD).

As the material of the second encapsulation layer is easily absorbable by water, in order to avoid corrosion of the plurality of pixel units in the final formed touch panel by water and oxygen, the boundary of the second encapsulation layer needs to be closer to the display region 111_a_ relative to the boundary of the first encapsulation layer (or the third encapsulation layer). In some embodiments, the boundary of the first encapsulation layer and the boundary of the third encapsulation layer may be collinear.

The boundary of the encapsulation film layer may refer to a boundary of the first encapsulation layer and a boundary of the third encapsulation layer that is further away from the display region 111_a_. Exemplarily, assuming that the boundary of the first encapsulation layer is further away from the display region 111_a_ relative to the boundary of the third encapsulation layer, the boundary of the encapsulation film layer may refer to the boundary of the first encapsulation layer. Assuming that the boundary of the third encapsulation layer is further away from the display region 111_a_ relative to the boundary of the first encapsulation layer, the boundary of the encapsulation film layer may refer to the boundary of the third encapsulation layer.

In the embodiments of the present disclosure, referring to FIG. 31, the target protection layer 12 may have a first opening. An orthographic projection of the first opening on the base substrate 111 covers the display region to expose the display region 111_a_. Moreover, the signal reception portion G1 of the connection interface G is also exposed from the target protection layer 12. The signal reception portion G1 is used to be connected to a driver circuit in the touch panel 1 to receive a driving signal provided by the driver circuit.

In some embodiments, referring to FIG. 15, FIG. 18, and FIG. 19, the display module 11 includes a gate layer a, an interlayer dielectric layer b, a first source-drain layer c, a first planarization layer d, a second source-drain layer d, and a second planarization layer e disposed on a side of the base substrate 111 and stacked in sequence. The plurality of conductive patterns in the conductive pattern group constituting the connection interfaces G include a gate conductive pattern disposed in the gate layer a, a first source-drain pattern c1 disposed in the first source-drain layer c, and a second source-drain pattern d1 disposed in the second source-drain layer d.

In the case that the target protection layer 12 is disposed between the display module 11 and the touch module 13, the connection interface G may only be composed of a plurality of conductive patterns in the conductive pattern group. In the case that the target protection layer 12 is disposed between the display module 11 and the touch module 13, the connection interface G may be composed of a plurality of conductive patterns in the conductive pattern group, a first touch connection pattern 13_a_1 disposed in the first touch layer 13_a_, and a second conductive pattern disposed in the second touch layer 13_b_.

In summary, the embodiments of the present disclosure provide a touch panel. A target protection layer may be obtained by etching an initial protection layer after forming a color filter layer. In addition, the initial protection layer may cover a connection interface in the display module, and is configured to protect the connection interface. Further, when the color filter layer is formed after the connection interface, even if a developing process needs to be performed using a developer, the pattern in the connection interface is not affected, and the yield of the connection interface can be ensured. After the preparation of the color filter layer is completed, the initial protection layer is etched, such that the signal reception portion of the connection interface is exposed from the finally obtained target protection layer, thereby enabling the signal reception portion to receive the drive signal provided by the drive circuit, and realizing the reception of the signal.

In the embodiments of the present disclosure, other structural features of the touch panel 1 can be referred to the method embodiments described above, and the embodiments of the present disclosure are not repeated herein.

The embodiments of the present disclosure also provide a touch panel, referring to FIGS. 30 to 32, the touch panel 1 includes a display module 11, a touch module 13, a first insulating layer 14, and a color filter layer 15 (only a third insulating layer 155 of the color filter layer 15 is shown in the figures).

The first insulating layer 14 is disposed on a side of the touch module 13 away from the display module 11, and an orthographic projection of the first insulating layer 14 on the base substrate 111 covers the display region 111_a_. The color filter layer 15 is disposed on a side of the first insulating layer 14 away from the display module 11.

In the embodiments of the present disclosure, the display module 11 includes a base substrate 111, a plurality of pixel units disposed on a side of the base substrate 111, a plurality of conductive pattern groups disposed on a side of the base substrate 111 and spaced apart, and an encapsulation film layer disposed on a side of the plurality of pixel units away from the base substrate 111.

Referring to FIG. 4, the base substrate 111 has a display region 111_a_ and a peripheral region 111_b_ surrounding the display region 111_a_. The peripheral region 111_b_ includes at least a bonding region 111_b_1. The bonding region 111_b_1 may be a region of the peripheral region 111_b_ disposed on the lower side of the display region 111_a_, and the bonding region 111_b_1 may be used to enable the flexible circuit board and the display module 11 to be bound.

The plurality of conductive pattern groups are disposed in the bonding region 111_b_1 of the peripheral region 111_b_ of the base substrate 111. Each conductive pattern group includes a plurality of conductive patterns stacked in sequence, and the plurality of conductive patterns included in each conductive pattern group is used to form one connection interface G. That is, the number of connection interfaces G formed may be the same as the number of conductive pattern groups included in the display module 11.

In some embodiments, the plurality of pixel units included in the display module 11 include a plurality of film layers. The plurality of film layers at least include a film layer where the plurality of conductive patterns forming the connection interface G are disposed. As a result, the plurality of conductive patterns can be formed synchronously in the process of forming the plurality of pixel units.

In the embodiments of the present disclosure, the encapsulation film layer can be used to encapsulate the plurality of pixel units, and the boundary of the encapsulation film layer is disposed between the connection interface G and the display region 111_a_. That is, the plurality of connection interfaces G can be exposed from the encapsulation film layer.

In some embodiments, the encapsulation film layer includes a first encapsulation layer, a second encapsulation layer, and a third encapsulation layer that are stacked in a direction away from the base substrate 111.

In some embodiments, the first encapsulation layer and the third encapsulation layer may be made of an inorganic material and the second encapsulation layer may be made of an organic material. For example, the first encapsulation layer and the third encapsulation layer may be made of one or more inorganic oxides such as silicon nitride (SiNx), silicon oxide (SiOx), and silicon nitride oxide (SiOxNy). The second encapsulation layer may be made of a resin material. The resin may be a thermoplastic resin or a thermosetting resin, the thermoplastic resin may include an acrylic (PMMA) resin, and the thermosetting resin may include an epoxy resin.

In the embodiments of the present disclosure, the second encapsulation layer may be prepared by using ink jet printing (IJP). The first encapsulation layer and the third encapsulation layer may be prepared by using a chemical vapor deposition (CVD).

In the embodiment of the present disclosures, one of the first encapsulation layer and the third encapsulation layer is a target encapsulation layer. The target encapsulation layer may be obtained by etching the initial encapsulation layer. A boundary of the initial encapsulation layer away from the display region 111*a* is further away from the display region 111*a* relative to a boundary of the other encapsulation layers away from the display region 111*a*. For example, assuming that the first encapsulation layer is the target encapsulation layer obtained by etching the initial encapsulation layer, a boundary of the first encapsulation layer away from the display region 111*a* is further away from the display region 111*a* relative to a boundary of the third encapsulation layer away from the display region 111*a*.

In some embodiments, the orthographic projection of the initial encapsulation layer on the base substrate 111 covers the orthographic projection of the connection interface G on the base substrate 111, thereby protecting the connection interface G.

Further, in the plurality of connection interfaces G included in the display module 11, some of the connection interfaces G may be touch interfaces. The touch interface may be used to transmit a signal for a touch electrode in the touch panel.

For the touch interface, the touch interface includes, in addition to a signal reception portion G1, a signal transmission portion G2. The signal transmission portion G2 is close to the display region 111*a* relative to the signal reception portion G1. The signal received by the signal reception portion G1 can thus be transmitted to the touch electrode through the signal transmission portion G2. The touch electrode may be disposed in a first touch layer 13*a*, and/or a second touch layer 13*b* in a touch module 13.

In this implementation, the initial encapsulation layer also has a plurality of third openings k3, and an orthographic projection of each of the third openings k3 on the base substrate 111 at least partially overlaps an orthographic projection of the signal transmission portion G2 on the base substrate 111 to expose at least a partial region of one signal transmission portion G2, such that the touch electrode in the subsequently formed touch module 13 is connected to the signal transmission portion G2 through the third opening K3.

In the case that the initial encapsulation layer to be formed has a plurality of third openings k3, taking the photoresist as a positive photoresist as an example, the mask is designed with a plurality of third mask openings. An orthographic projection of the third mask opening on the base substrate 111 at least partially overlaps the orthographic projection of the signal transmission portion G2 on the base substrate 111.

In the embodiments of the present disclosure, after the color filter layer 15 is prepared, the initial encapsulation layer may be etched to obtain a target encapsulation layer. The signal reception portion G1 of the connection interface G is exposed from the target encapsulation layer, so as to enable the signal reception portion G1 to be connected to a driver circuit in the touch panel 1 to receive a driving signal provided by the driver circuit.

In some embodiments, referring to FIG. 30 and FIG. 31, the display module 11 includes a gate layer a, an interlayer dielectric layer b, a first source-drain layer c, a first planarization layer d, a second source-drain layer d, and a second planarization layer e disposed on a side of the base substrate 111 and stacked in sequence. The plurality of conductive patterns in the conductive pattern group constituting the connection interface G includes a gate pattern a1 disposed in the gate layer a, a first source-drain pattern c1 disposed in the first source-drain layer c, and a second source-drain pattern d1 disposed in the second source-drain layer d.

In summary, the embodiments of the present disclosure provide a touch panel. A target protection layer may be obtained by etching an initial protection layer after forming a color filter layer. In addition, the initial protection layer may cover a connection interface in the display module, and is configured to protect the connection interface. Further, in the subsequent process of forming the color filter layer, even if the developer needs to be used for the developing process, the pattern in the connection interface is not affected, and the yield of the connection interface can be ensured. After the preparation of the color filter layer is completed, the initial protection layer is etched, such that the signal reception portion of the connection interface is exposed from the finally obtained target protection layer, thereby enabling the signal reception portion to receive the drive signal provided by the drive circuit, and realizing the reception of the signal.

In the embodiments of the present disclosure, other structural features of the touch panel 1 can be referred to the method embodiments described above, and the embodiments of the present disclosure are not repeated herein.

Figure 33:
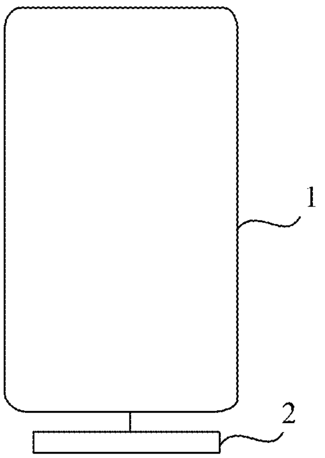
FIG. 33 is a schematic structural diagram of a touch device according to some embodiments of the present disclosure.

FIG. 33 is a schematic structural diagram of a touch device according to some embodiments of the present disclosure. Referring to FIG. 33, the touch device includes a power supply assembly 2 and a touch panel 100 as provided in the above embodiments. The power supply assembly 200 is used for supplying power to the touch panel 1.

In some embodiments, the touch device may be a liquid crystal display (LCD) display device, an organic light-emitting diode (OLED) display device, or a quantum dot light-emitting diode (QLED) display device. The touch device may be any suitable display device, including but not limited to cell phones, tablet computers, televisions, monitors, laptops, digital photo frames, navigators, e-books, and any other products or components with display functions.

As the touch device may have essentially the same technical effect as the touch panel described in the previous embodiments, the technical effect of the touch device is not repeated here for the purpose of brevity.

The terms used in the embodiments of the present disclosure are used only for the purpose of explaining the embodiments of the present disclosure and are not intended to limit the present disclosure. Unless otherwise defined, technical terms or scientific terms used in the embodiments of the present disclosure should have the ordinary meaning understood by a person of ordinary skill in the field to which the present disclosure belongs.

The terms used in the embodiments of the present disclosure are merely intended for the purpose of explaining the embodiments of the present disclosure and are not intended to limit the present disclosure. Unless otherwise defined, technical or scientific terms used in the embodiments of the present disclosure shall have the same meanings as commonly understood by a person of ordinary skill in the art to which the present disclosure belongs. The terms “first,” “second,” “third,” and the like used in the specification and the claims of the present disclosure do not indicate any order, number, or importance, but are used only to distinguish between different components. Likewise, similar words "a" or "an" do not indicate a quantity limitation, but indicate that there is at least one. The terms "include" or "comprise" and the like are intended to indicate that the elements or objects before "include" or "comprise" encompass the elements or objects listed after "include" or "comprise" and their equivalents, and do not exclude other elements or objects. The terms "connect" or "connected" and the like are not limited to physical or mechanical connections, but may include electrical connections, whether direct or indirect. The terms "upper," "lower," "left," "right," etc. are only used to represent relative position relationships, and when the absolute position of the object to be described changes, the relative position relationship may also be changed accordingly.

The foregoing descriptions are merely optional embodiments of the present disclosure and are not intended to limit the present disclosure. Any modification, equivalent replacement, and improvement within the spirit and principle of the present disclosure shall be included within the protection scope of the present disclosure.

The invention claimed is:

1. A method for preparing a touch panel, comprising:

forming a display module, wherein forming the display module comprises: acquiring a base substrate having a display region and a peripheral region surrounding the display region, the peripheral region comprising a bonding region; forming a plurality of pixel units and a plurality of conductive pattern groups spaced apart on a side of the base substrate, wherein the plurality of pixel units are disposed in the display region, the plurality of conductive pattern groups are disposed in the bonding region, each of the conductive pattern groups comprises a plurality of conductive patterns stacked in sequence, the plurality of conductive patterns in each of the conductive pattern groups forming a connection interface; and forming an encapsulation film layer on a side of the plurality of pixel units away from the base substrate, wherein the encapsulation film layer is configured to encapsulate the plurality of pixel units, and a boundary of the encapsulation film layer is disposed between the connection interface and the display region;

forming an initial protection layer on a side of the encapsulation film layer away from the base substrate, an orthographic projection of the initial protection layer on the base substrate covering an orthographic projection of the connection interface on the base substrate;

forming a touch module on a side of the initial protection layer away from the display module;

forming a first insulating layer on a side of the touch module away from the display module, an orthographic projection of the first insulating layer on the base substrate covering the display region;

forming a color filter layer on a side of the first insulating layer away from the display module; and acquiring a target protection layer by etching the initial protection layer, wherein an orthographic projection of the target protection layer on the base substrate does not overlap an orthographic projection of a signal reception portion of the connection interface on the base substrate, the signal reception portion being connected to a driver circuit in the touch panel to receive a driving signal provided by the driver circuit.

2. The method according to claim 1, wherein the plurality of connection interfaces comprises a plurality of touch interfaces, wherein each of the touch interfaces comprises a signal reception portion and a signal transmission portion, the signal transmission portion being close to the display region relative to the signal reception portion;

the initial protection layer further comprises a plurality of first openings, wherein an orthographic projection of each of the first openings on the base substrate at least partially overlaps an orthographic projection of the signal transmission portion on the base substrate to expose at least a partial region of one signal transmission portion; and forming the touch module comprises: forming a first touch layer, a touch insulating layer, and a second touch layer in sequence on a side of the initial protection layer away from the base substrate;

wherein the first touch layer comprises a plurality of first touch connection patterns disposed in the bonding region, each of the first touch connection patterns and the signal transmission portion being connected through a first opening; the touch insulating layer has a plurality of second openings, an orthographic projection of each of the second openings on the base substrate partially overlapping an orthographic projection of the first touch connection pattern on the base substrate; and the second touch layer comprises a plurality of second touch connection patterns disposed in the bonding region, a second touch connection pattern and the first touch connection pattern being connected through a second opening.

3. The method according to claim 2, wherein the touch module comprises a first touch electrode and a second touch electrode disposed in the display region and insulated from each other;

the first touch layer further comprises a plurality of first touch connection lines corresponding to the plurality of first touch connection patterns, one end of each of the first touch connection lines being connected to a corresponding first touch connection pattern, and another end of each of the first touch connection lines being connected to the first touch electrode or the second touch electrode; and the second touch layer comprises a plurality of second touch connection lines corresponding to the plurality of second touch connection patterns, one end of each of the second touch connection lines being connected to a corresponding second touch connection pattern, and another end of each of the second touch connection lines being connected to the first touch electrode or the second touch electrode.

4. The method according to claim 2, wherein a boundary of the first opening away from the display region and a boundary of the target protection layer away from the display region are collinear; and a boundary of the second opening away from the display region and a boundary of the touch insulating layer away from the display region are collinear; and a boundary of the second touch connection pattern away from the display region is disposed on a side, close to the display region, of a boundary of the first insulating layer away from the display region.

5. The method according to claim 2, wherein the orthographic projection of the first opening on the base substrate is disposed within the orthographic projection of the second opening on the base substrate, and an area of the orthographic projection of the first opening on the base substrate is less than an area of the orthographic projection of the second opening on the base substrate; or, the orthographic projection of the second opening on the base substrate is disposed within the orthographic projection of the first opening on the base substrate, and an area of the orthographic projection of the second opening on the base substrate is less than the orthographic projection of the first opening on the base substrate.

6. The method according to claim 1, wherein before forming the touch module, the method further comprises:

forming a second insulating layer on a side of the initial protection layer away from the base substrate, wherein an orthographic projection of the second insulating layer on the base substrate covers the display region, and a boundary of the second insulating layer is disposed between the connection interface and the display region.

7. The method according to claim 1, wherein the color filter layer comprises a black matrix structure, a plurality of first color resist blocks of a first color, a plurality of second color resist blocks of a second color, a plurality of third color resist blocks of a third color, and a third insulating layer; and forming the color filter layer comprises:

forming a black matrix film, wherein the black matrix structure is acquired by patterning the black matrix film using a first mask, the black matrix structure has a plurality of hollowed-out regions, each of the hollowed-out regions forming a color resist block;

forming a first color resist film of a first color, wherein the plurality of first color resist blocks of the first color are acquired by patterning the first color resist film using a second mask, each of the first color resist blocks of the first color being disposed in one of the hollowed-out regions;

forming a second color resist film of a second color, wherein the plurality of second color resist blocks of the second color are acquired by patterning the second color resist film using a third mask, each of the second color resist blocks of the second color being disposed in one of the hollowed-out regions;

forming a third color resist film of a third color, wherein the plurality of third color resist blocks of the third color are acquired by patterning the third color resist film using a fourth mask, each of the third color resist blocks of the third color being disposed in one of the hollowed-out regions; and forming a third insulating film, wherein the third insulating layer is acquired by patterning the third insulating film using a fifth mask, an orthographic projection of the third insulating layer on the base substrate covers the display region, and a boundary of the third insulating layer away from the display region is farther from the display region relative to a boundary of the first insulating layer away from the display region, wherein a boundary of a touch insulating layer of the touch module away from the display region, a boundary of the first insulating layer away from the display region, and a boundary of the third insulating layer away from the display region are arranged in a direction away from the display region;

wherein a boundary of the target protection layer away from the display region and a boundary of the third insulating layer away from the display region are collinear.

8. The method according to claim 1, wherein a touch insulating layer, the first insulating layer, a second insulating layer, and a third insulating layer in the touch panel are all made of organic materials; and the target protection layer in the touch panel is made of an inorganic material.

9. The method according to claim 1, wherein the display module comprises a gate layer, an interlayer dielectric layer, a first source-drain layer, a first planarization layer, a second source-drain layer, and a second planarization layer that are disposed on a side of the base substrate and stacked in sequence; and the plurality of conductive patterns in each of the conductive pattern groups forming the connection interface comprise a gate pattern disposed in the gate layer, a first source-drain pattern disposed in the first source-drain layer, and a second source-drain pattern disposed in the second source-drain layer.

10. A method for preparing a touch panel, comprising:

forming an initial display module, forming the initial display module comprising: acquiring a base substrate having a display region and a peripheral region surrounding the display region, the peripheral region comprising a bonding region; forming a plurality of pixel units and a plurality of conductive pattern groups spaced apart on a side of the base substrate, wherein the plurality of pixel units are disposed in the display region, the plurality of conductive pattern groups are disposed in the bonding region, each of the conductive pattern groups comprises a plurality of conductive patterns stacked in sequence, the plurality of conductive patterns in each of the conductive pattern groups forming a connection interface; and forming an initial encapsulation film layer on a side of the plurality of pixel units away from the base substrate, wherein the initial encapsulation film layer is configured to encapsulate the plurality of pixel units, and the initial encapsulation film layer comprises an initial encapsulation layer, an orthographic projection of the initial encapsulation layer on the base substrate covering the display region and an orthographic projection of the connection interface on the base substrate;

forming a touch module on a side of the encapsulation film layer away from the display module;

forming a first insulating layer on a side of the touch module away from the display module, an orthographic projection of the first insulating layer on the base substrate covering the display region;

forming a color filter layer on a side of the touch module away from the display module; and acquiring an encapsulation film layer comprising a target encapsulation layer by etching the initial encapsulation layer, thereby acquiring a display module comprising the encapsulation film layer, wherein the target encapsulation layer is configured to expose a signal reception portion of the connection interface, the signal reception portion being connected to a driver circuit in the touch panel to receive a driving signal provided by the driver circuit.

11. The method according to claim 10, wherein the plurality of connection interfaces comprises a plurality of touch interfaces, wherein each of the touch interfaces comprises a signal reception portion and a signal transmission portion, the signal transmission portion being close to the display region relative to the signal reception portion;

the initial encapsulation layer has a plurality of third openings, wherein an orthographic projection of each of the third openings on the base substrate at least partially overlaps an orthographic projection of the signal transmission portion on the base substrate to expose at least a partial region of one signal transmission portion;

forming the touch module comprises: forming a first touch layer, a touch insulating layer, and a second touch layer in sequence on a side of the encapsulation film layer away from the base substrate;

wherein the first touch layer comprises a plurality of first touch connection patterns disposed in the bonding region, a first touch connection pattern and the signal transmission portion being connected through a third opening; the touch insulating layer has a plurality of second openings, an orthographic projection of each of the second openings on the base substrate partially overlapping an orthographic projection of the first touch connection pattern on the base substrate; and the second touch layer comprises a plurality of second touch connection patterns, a second touch connection pattern and the first touch connection pattern being connected through the third opening;

wherein a boundary of the third opening away from the display region and a boundary of the target encapsulation layer away from the display region are collinear; and a boundary of the second opening away from the display region and a boundary of the touch insulating layer away from the display region are collinear; and a boundary of the second touch connection pattern away from the display region disposed on a side, close to the display region, of a boundary of the first insulating layer away from the display region.

12. A touch panel, comprising: a display module, a target protection layer, a touch module, a first insulating layer, and a color filter layer; wherein the target protection layer is disposed between the display module and the touch module or disposed on a side of the touch module away from the display module; the first insulating layer is disposed on the side of the touch module away from the display module, and the color filter layer is disposed on a side of the first insulating layer away from the display module; and the display module comprises:

a base substrate, wherein the base substrate has a display region and a peripheral region surrounding the display region, the peripheral region comprising a bonding region;

a plurality of pixel units disposed on a side of the base substrate and in the display region;

a plurality of conductive pattern groups disposed on a side of the base substrate and spaced apart, wherein the plurality of conductive pattern groups are disposed in the bonding region, each of the conductive pattern groups comprises a plurality of conductive patterns stacked in sequence, and each of the conductive pattern groups comprises a plurality of conductive patterns for forming a connection interface; and an encapsulation film layer disposed on a side of the plurality of pixel units away from the base substrate, wherein the encapsulation film layer is configured to encapsulate the plurality of pixel units, and a boundary of the encapsulation film layer is disposed between the connection interface and the display region;

wherein an orthographic projection of the target protection layer on the base substrate does not overlap an orthographic projection of a signal reception portion of the connection interface on the base substrate, the signal reception portion being connected to a driver circuit in the touch panel to receive a driving signal provided by the driver circuit; and an orthographic projection of the first insulating layer on the base substrate covers the display region.

13. The touch panel according to claim 12, wherein the touch module comprises a first touch layer, a touch insulating layer, and a second touch layer stacked in sequence;

the touch panel further comprises a second insulating layer disposed between the target protection layer and the touch module; and the color filter layer comprises a black matrix structure, a plurality of first color resist blocks of a first color, a plurality of second color resist blocks of a second color, a plurality of third color resist blocks of a third color, and a third insulating layer, wherein the plurality of first color resist blocks of the first color, the plurality of second color resist blocks of the second color, and the plurality of third color resist blocks of the third color are disposed in a same layer and spaced apart, the black matrix structure is disposed between adjacent color resist blocks, and the third insulating layer is disposed on a side of the black matrix structure and color resist blocks away from the display module;

wherein the first insulating layer, the second insulating layer, the third insulating layer, and the touch insulating layer are all made of organic materials; and the target protection layer is made of an inorganic material.

14. The touch panel according to claim 13, wherein the plurality of connection interfaces comprises a plurality of touch interfaces, wherein each of the touch interfaces comprises a signal reception portion and a signal transmission portion, the signal transmission portion being close to the display region relative to the signal reception portion;

the target protection layer further comprises a plurality of first openings, wherein an orthographic projection of each of the first openings on the base substrate at least partially overlaps an orthographic projection of the signal transmission portion on the base substrate to expose at least a partial region of one signal transmission portion; and the first touch layer comprises a plurality of first touch connection patterns disposed in the bonding region, a first touch connection pattern and the signal transmission portion being connected through a first opening; the touch insulating layer has a plurality of second openings, an orthographic projection of each of the second openings on the base substrate partially overlapping an orthographic projection of the first touch connection pattern on the base substrate; and the second touch layer comprises a plurality of second touch connection patterns disposed in the bonding region, a second touch connection pattern and the first touch connection pattern being connected through a second opening.

15. The touch panel according to claim 14, wherein the touch module comprises a first touch electrode and a second touch electrode disposed in the display region and insulated from each other;

the first touch layer further comprises a plurality of first touch connection lines corresponding to the plurality of first touch connection patterns, one end of each of the first touch connection lines being connected to a corresponding first touch connection pattern, and another end of each of the first touch connection lines being connected to the first touch electrode or the second touch electrode; and the second touch layer comprises a plurality of second touch connection lines corresponding to the plurality of second touch connection patterns, one end of each of the second touch connection lines being connected to a corresponding second touch connection pattern, and another end of each of the second touch connection lines being connected to the first touch electrode or the second touch electrode.

16. The touch panel according to claim 14, wherein a boundary of the first opening away from the display region and a boundary of the target protection layer away from the display region are collinear; and a boundary of the second opening away from the display region and a boundary of the touch insulating layer away from the display region are collinear; and a boundary of the second touch connection pattern away from the display region is disposed on a side, close to the display region, of a boundary of the first insulating layer away from the display region.

17. The touch panel according to claim 14, wherein the orthographic projection of the first opening on the base substrate is disposed within the orthographic projection of the second opening on the base substrate, and an area of the orthographic projection of the first opening on the base substrate is less than an area of the orthographic projection of the second opening on the base substrate; or, the orthographic projection of the second opening on the base substrate is disposed within the orthographic projection of the first opening on the base substrate, and an area of the orthographic projection of the second opening on the base substrate is less than the orthographic projection of the first opening on the base substrate.

18. The touch panel according to claim 13, wherein a boundary of the touch insulating layer away from the display region, a boundary of the first insulating layer away from the display region, and a boundary of the third insulating layer away from the display region are arranged in a direction away from the display region;

wherein a boundary of the target protection layer away from the display region and a boundary of the third insulating layer away from the display region are collinear.

19. The touch panel according to claim 12, wherein the display module comprises a gate layer, an interlayer dielectric layer, a first source-drain layer, a first planarization layer, a second source-drain layer, and a second planarization layer that are disposed on a side of the base substrate and stacked in sequence; and the plurality of conductive patterns in each of the conductive pattern groups forming the connection interface comprise a gate pattern disposed in the gate layer, a first source-drain pattern disposed in the first source-drain layer, and a second source-drain pattern disposed in the second source-drain layer wherein the second planarization layer has a second via, the second via being configured for connecting a second source-drain pattern to a first touch connection pattern of the first touch layer in the touch module;

an orthographic projection of a first opening in the target protection layer on the base substrate and an orthographic projection of a second opening in a touch insulating layer comprised in the touch module on the base substrate are disposed within an orthographic projection of the second via on the base substrate; and a boundary of the second via close to the display region is disposed on a side of a boundary of the touch insulating layer close to the display region, and a boundary of the second via away from the display region is disposed on a side of a boundary of the target protection layer away from the display region.

20. The touch panel according to claim 12, wherein the target protection layer further comprises a fourth opening, wherein an orthographic projection of the fourth opening covers the display region to expose the display region.

* * * * *